(12) United States Patent
Chary et al.

(10) Patent No.: US 11,069,598 B2
(45) Date of Patent: Jul. 20, 2021

(54) MEMORY ARRAYS AND METHODS USED IN FORMING A MEMORY ARRAY AND CONDUCTIVE THROUGH-ARRAY-VIAS (TAVS)

(71) Applicant: Micron Technology, Inc., Boise, ID (US)

(72) Inventors: Indra V. Chary, Boise, ID (US); Chet E. Carter, Boise, ID (US); Anilkumar Chandolu, Boise, ID (US); Justin B. Dorhout, Boise, ID (US); Jun Fang, Boise, ID (US); Matthew J. King, Boise, ID (US); Brett D. Lowe, Boise, ID (US); Matthew Park, Boise, ID (US); Justin D. Shepherdson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 16/444,634

(22) Filed: Jun. 18, 2019

(65) Prior Publication Data

US 2020/0402890 A1 Dec. 24, 2020

(51) Int. Cl.
*H01L 23/48* (2006.01)
*H01L 27/11582* (2017.01)
*H01L 27/11565* (2017.01)
*H01L 21/311* (2006.01)
*H01L 21/033* (2006.01)
*H01L 21/768* (2006.01)
(Continued)

(52) U.S. Cl.
CPC ........ *H01L 23/481* (2013.01); *H01L 21/0337* (2013.01); *H01L 21/31111* (2013.01); *H01L 21/76897* (2013.01); *H01L 27/11565* (2013.01); *H01L 27/11582* (2013.01); *H01L 29/40117* (2019.08); *H01L 27/11519* (2013.01); *H01L 27/11556* (2013.01)

(58) Field of Classification Search
CPC .............. H01L 23/481; H01L 21/0337; H01L 27/11582; H01L 27/11565; H01L 27/11519
See application file for complete search history.

(56) References Cited

U.S. PATENT DOCUMENTS 9,728,548 B2 * 8/2017 Freeman .......... H01L 27/11582
10,236,301 B1 * 3/2019 Howder ............ H01L 23/53271
(Continued)

FOREIGN PATENT DOCUMENTS

WO WO 7/2020
PCT/US2020/026998

*Primary Examiner* — Nicholas J Tobergte
(74) *Attorney, Agent, or Firm* — Wells St. John P.S.

(57) ABSTRACT

A method used in forming a memory array and conductive through-array-vias (TAVs) comprises forming a stack comprising vertically-alternating insulative tiers and wordline tiers. A mask is formed comprising horizontally-elongated trench openings and operative TAV openings above the stack. Etching is conducted of unmasked portions of the stack through the trench and operative TAV openings in the mask to form horizontally-elongated trench openings in the stack and to form operative TAV openings in the stack. Conductive material is formed in the operative TAV openings in the stack to form individual operative TAVs in individual of the operative TAV openings in the stack. A wordline-intervening structure is formed in individual of the trench openings in the stack.

22 Claims, 17 Drawing Sheets

(51) Int. Cl.
*H01L 21/28* (2006.01)
*H01L 27/11556* (2017.01)
*H01L 27/11519* (2017.01)

(56) References Cited

U.S. PATENT DOCUMENTS

| | | | |
|---|---|---|---|
| 10,580,783 B2* | 3/2020 | Cui | H01L 27/11565 |
| 10,756,105 B2* | 8/2020 | Fukuzumi | H01L 27/11565 |
| 2014/0077126 A1* | 3/2014 | Benson | C09K 13/00 |
| | | | 252/79.1 |
| 2015/0011063 A1* | 1/2015 | Hull | H01L 21/02178 |
| | | | 438/261 |
| 2017/0092733 A1 | 3/2017 | Makala et al. | |
| 2017/0194348 A1* | 7/2017 | Hopkins | H01L 29/66833 |
| 2017/0263620 A1* | 9/2017 | Lee | H01L 27/11565 |
| 2018/0268902 A1 | 9/2018 | Tanaka | |
| 2018/0301374 A1 | 10/2018 | Masamori et al. | |
| 2019/0074287 A1 | 3/2019 | Yagi et al. | |
| 2019/0115357 A1 | 4/2019 | Oh et al. | |

* cited by examiner

US 11,069,598 B2

MEMORY ARRAYS AND METHODS USED IN FORMING A MEMORY ARRAY AND CONDUCTIVE THROUGH-ARRAY-VIAS (TAVS)

TECHNICAL FIELD

Embodiments disclosed herein pertain to memory arrays and to methods used in forming a memory array and conductive through-array-vias (TAVs).

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

DETAILED DESCRIPTION OF EXAMPLE EMBODIMENTS

Embodiments of the invention encompass methods used in forming a memory array and conductive through-array-vias (TAVs), for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-33 which may be considered as a "gate-last" or "replacement-gate" process.

Figure 1:
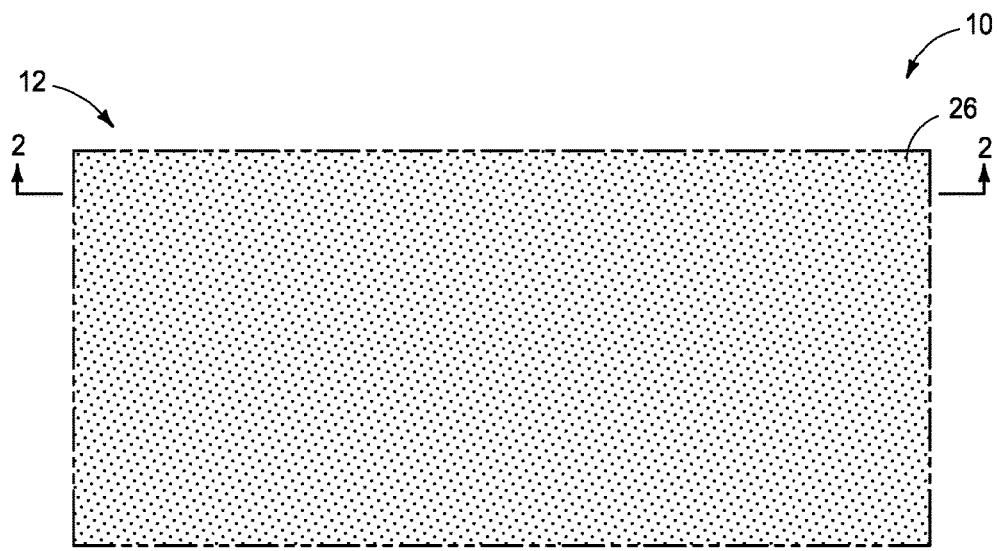
FIG. 1 is a diagrammatic cross-sectional view of a portion of a substrate in process in accordance with an embodiment of the invention and is taken through line 1-1 in FIG. 2.
Figure 2:
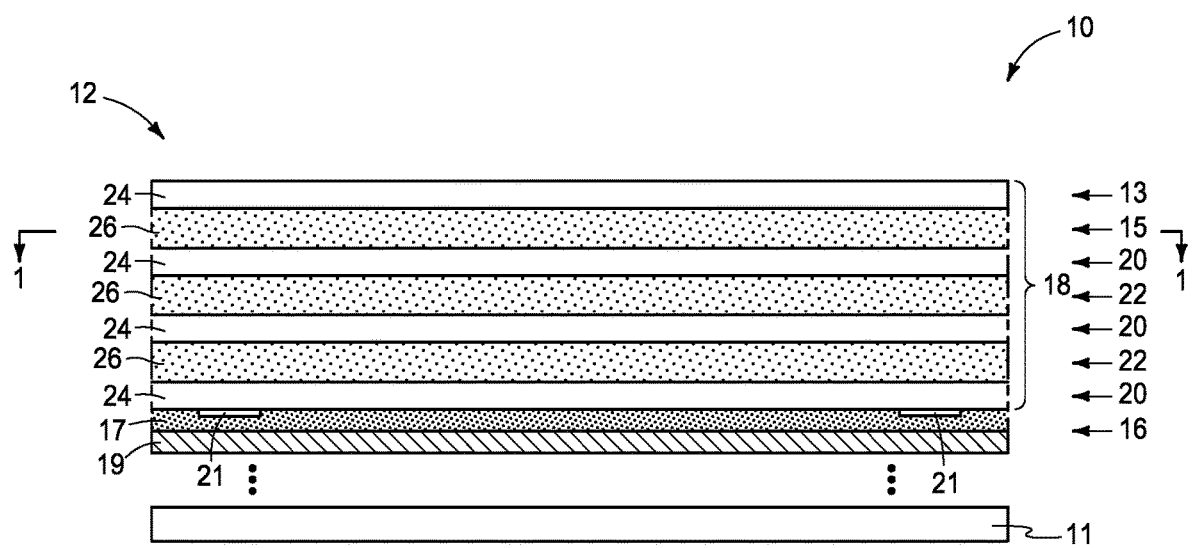
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Example construction 10 comprises a conductive tier 16 that has been formed above substrate 11. Example conductive tier 16 is shown as comprising conductive material 17 (e.g., conductively-doped semiconductive material such as conductively-doped polysilicon) above metal material 19

(e.g., WSi$_x$). An etch-stop region 21 may be within conductive material 17. Region 21 may be conductive, insulative, or semiconductive, with elemental tungsten being an example, and may be sacrificial. Conductive tier 16 may comprise part of control circuitry (e.g., peripheral-under-array circuitry and/or a common source line or plate) used to control read and write access to the transistors and/or memory cells that will be formed within array 12.

A stack 18 has been formed above conductive tier 16. In some embodiments, stack 18 comprises an uppermost insulating tier 13, an uppermost conductor tier 15 below uppermost insulating tier 13, and alternating insulative tiers 20 and wordline tiers 22 below uppermost conductor tier 15. Example thickness for each of such tiers is 25 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductive tiers 16 and stack 18. For example, multiple vertically alternating tiers of conductive material and insulative material of such circuitry may be below a lowest of wordline tiers 22 and/or above an uppermost of wordline tiers 22. For example, one or more select gate tiers (not shown) may be between conductive tier 16 and the lowest wordline tier 22 and one or more select gate tiers may be above an uppermost of wordline tiers 22. Regardless, uppermost conductor tier 15 may be a wordline tier or may not be a wordline tier. Regardless, wordline tiers 22 and uppermost conductor tier 15 may not comprise conductive material at this point in processing in conjunction with the hereby initially-described example method embodiment which is "gate-last" or "replacement-gate". Further, insulative tiers 20 and uppermost insulating tier 13 may not comprise insulative material or be insulative at this point in processing. Example wordline tiers 22 and uppermost conductor tier 15 comprise first material 26 (e.g., silicon nitride) which may be wholly or partially sacrificial. Example insulative tiers 20 and uppermost insulating tier 13 comprise second material 24 (e.g., silicon dioxide) that is of different composition from that of first material 26 and which may be wholly or partially sacrificial.

Figure 3:
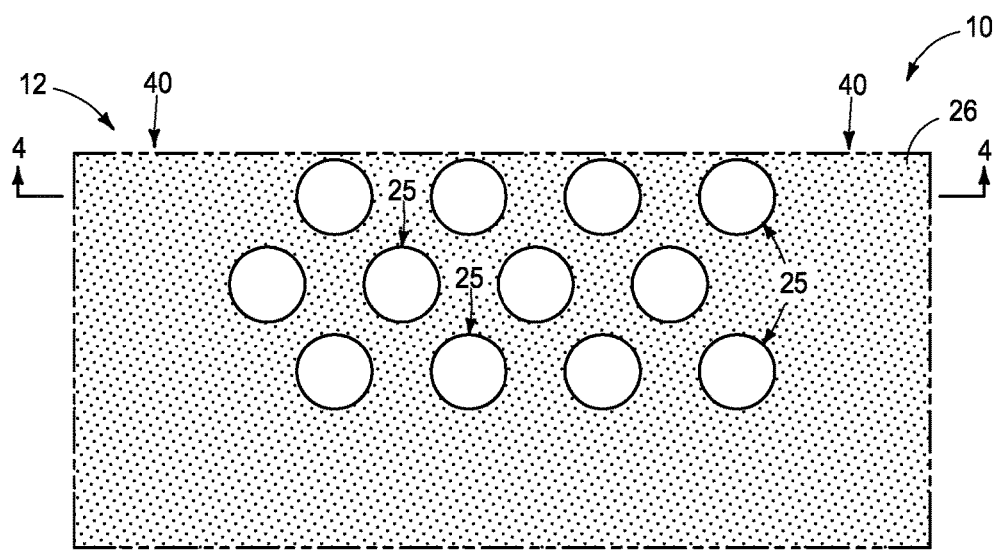
FIGS. 3-33 are diagrammatic sequential sectional and/or enlarged views of the construction of FIG. 1 in process in accordance with some embodiments of the invention.
Figure 4:
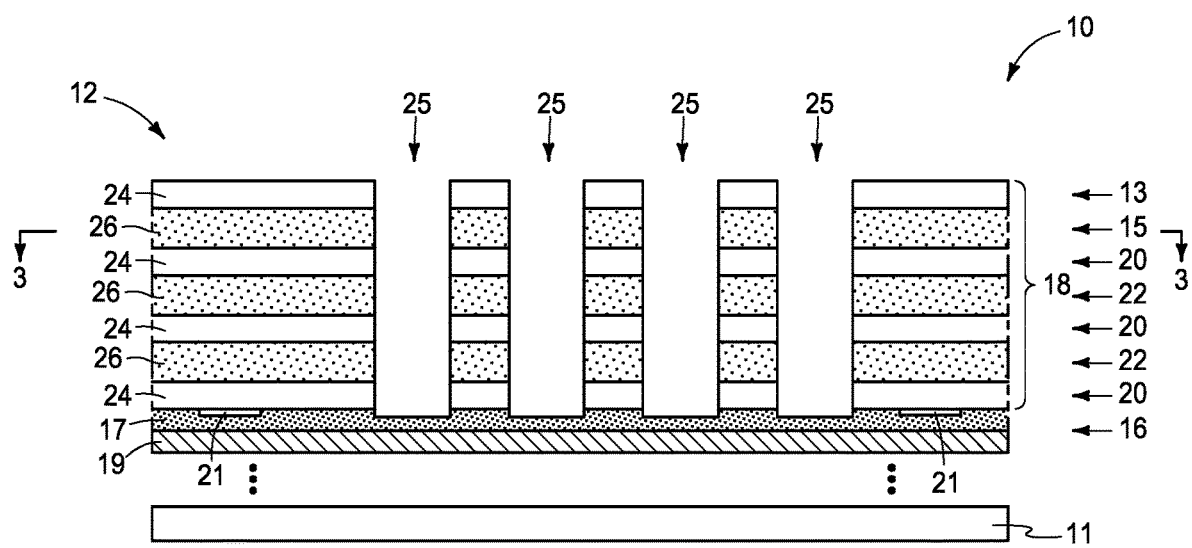

Referring to FIGS. 3 and 4, and in one embodiment, channel openings 25 have been etched through insulative tiers 20 and wordline tiers 22 (and tiers 13 and 15) to material 17 of conductive tier 16. Channel openings 25 may go partially into material 17 as shown, may stop there-atop (not shown), or go completely there-through (not shown) either stopping on material 19 or going at least partially there-into. Alternately, as an example, channel openings 25 may stop atop or within lowest insulative tier 20. A reason for extending channel openings 25 at least to material 17 is to assure direct electrical coupling of subsequently-formed channel material (not yet shown) to conductive tier 16 without using alternative processing and structure to do so when such a connection is desired. Etch-stop material (not shown) may be within conductive material 17 to facilitate stopping of the etching of channel openings 25 to be atop conductive tier 16 when such is desired. Such etch-stop material may be sacrificial or non-sacrificial. By way example and for brevity only, channel openings 25 are shown as being arranged in groups or columns of staggered rows of four openings 25 per row. Any alternate existing or future-developed arrangement and construction may be used.

Transistor channel material may be formed in the individual channel openings elevationally along the insulative tiers and the wordline tiers, thus comprising individual channel-material strings, which is directly electrically coupled with conductive material in the conductive tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

Figure 5:
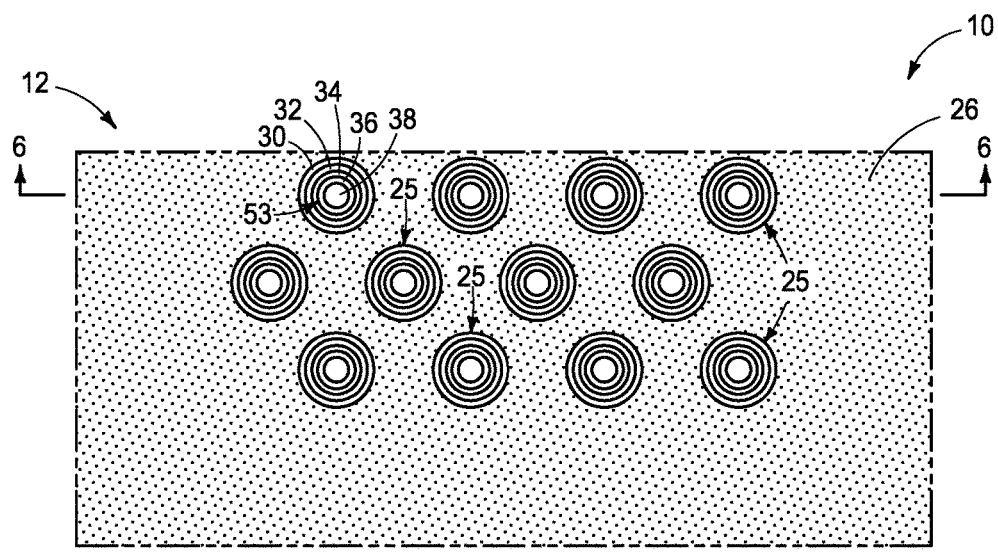
Figure 6:
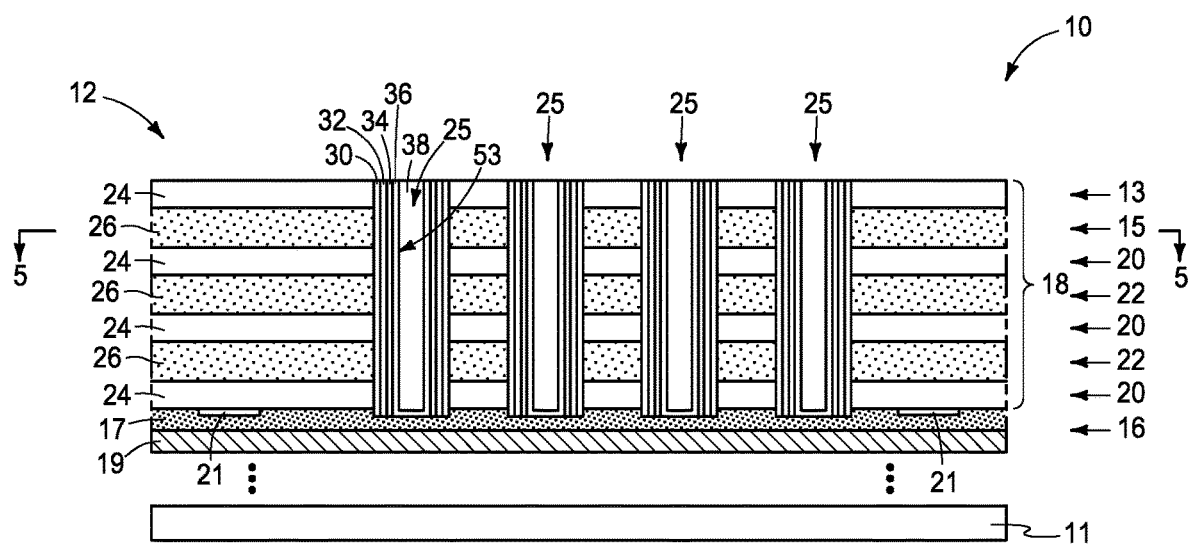

FIGS. 5 and 6 show one embodiment wherein charge-blocking material 30, storage material 32, and charge-passage material 34 have been formed in individual channel openings 25 elevationally along insulative tiers 20 and wordline tiers 22. Transistor materials 30, 32, and 34 (e.g., memory cell materials) may be formed by, for example, deposition of respective thin layers thereof over stack 18 and within individual channel openings 25 followed by planarizing such back at least to an uppermost surface of stack 18. Channel material 36 has been formed in channel openings 25 elevationally along insulative tiers 20 and wordline tiers 22, thus comprising individual channel-material strings 53. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductive tier 16 such that channel material 36 is directly against conductive material 17 of conductive tier 16. Alternately, and by way of example only, no punch etching may be conducted and channel material 36 may be directly electrically coupled to material 17/19 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 7:
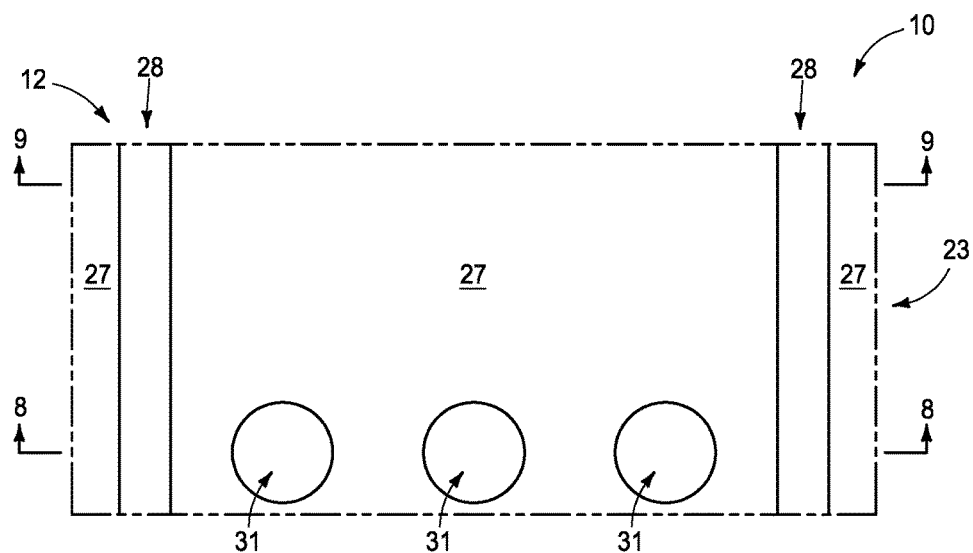
Figure 8:
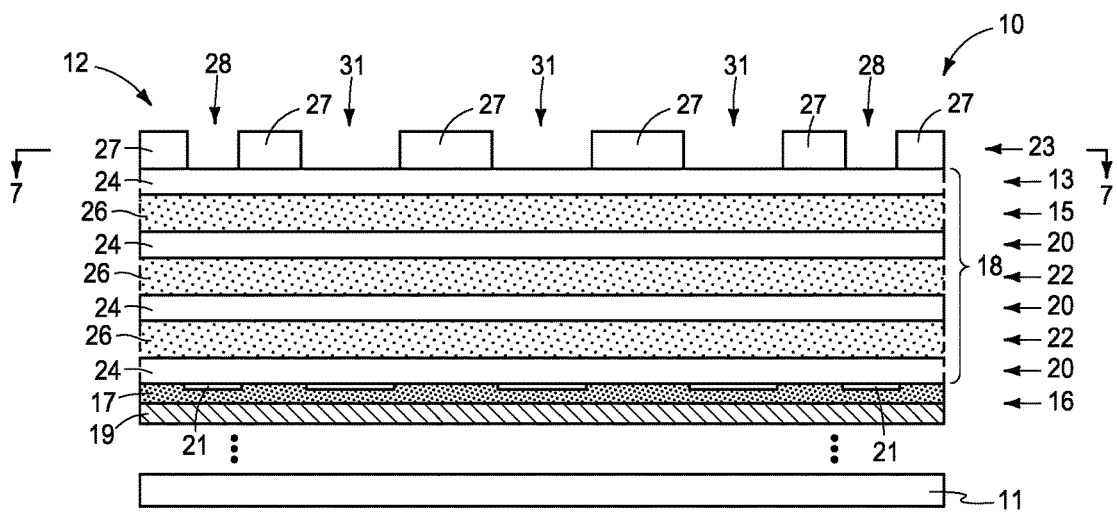
Figure 9:
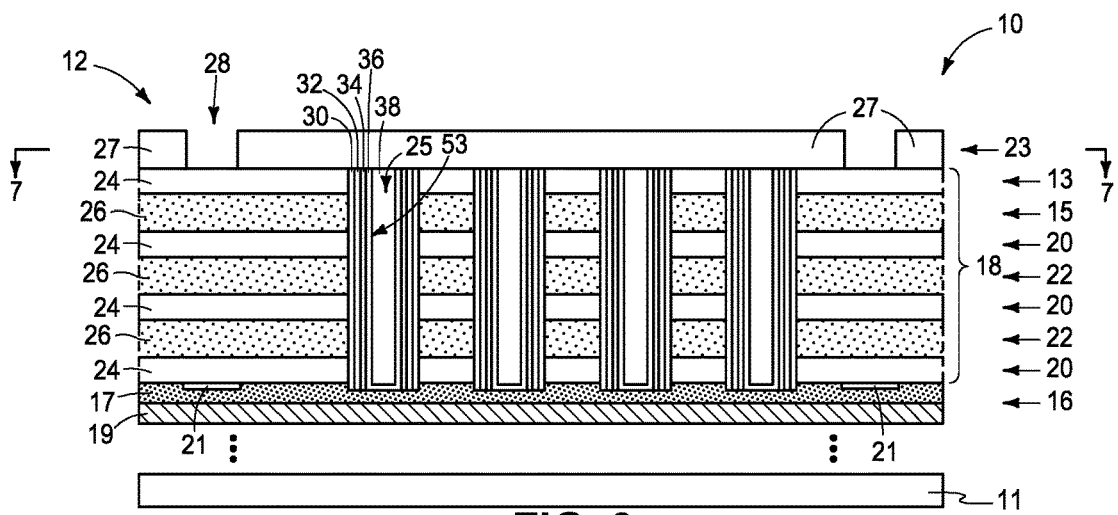

Referring to FIGS. 7-9, a mask 23 comprising masking material 27 (e.g., photoresist) has been formed above stack 18. Mask 23 comprises horizontally-elongated trench openings 28 and operative through-array-via (TAV) openings 31. In the context of this document, an "operative TAV opening" is an opening in which conductive material is or will be formed in the stack and which is an operating conductive interconnect between electronic components at different elevations in a finished construction of integrated circuitry that has been or is being fabricated. Immediately-adjacent of horizontally-elongated trench openings 28 in mask 23 may comprise longitudinal shape of longitudinal outlines of individual wordlines to be formed in individual wordline tiers 22. Example operative TAV openings 31 are shown as being between trench openings 28 and thereby within longitudinal outlines of the individual wordlines and at an end of a grouping of channel openings 25. Alternate placement of operative TAV openings 31 may be used. For example, one or more operative TAV openings may be placed among a grouping of channel openings 25 and/or outside of immediately-adjacent trench openings 28 outside of any wordline outline.

Figure 10:
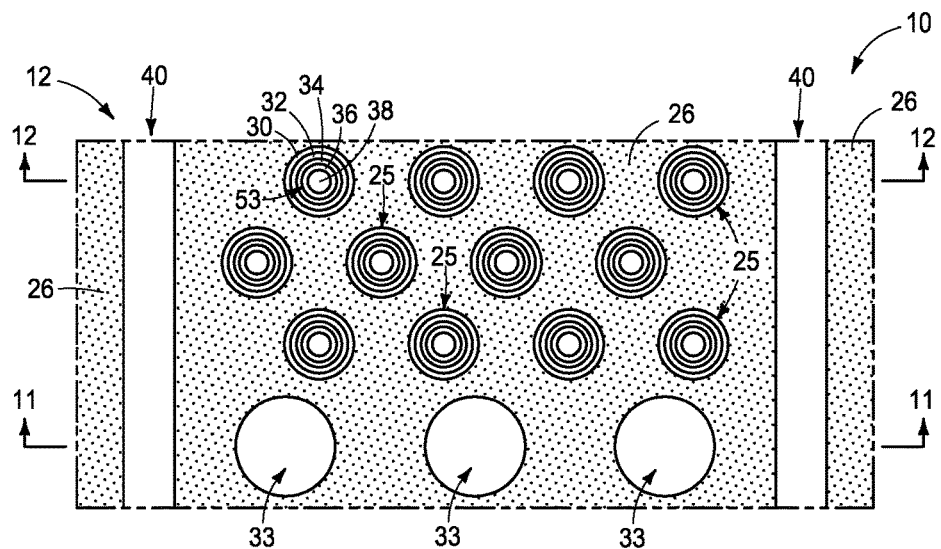
Figure 11:
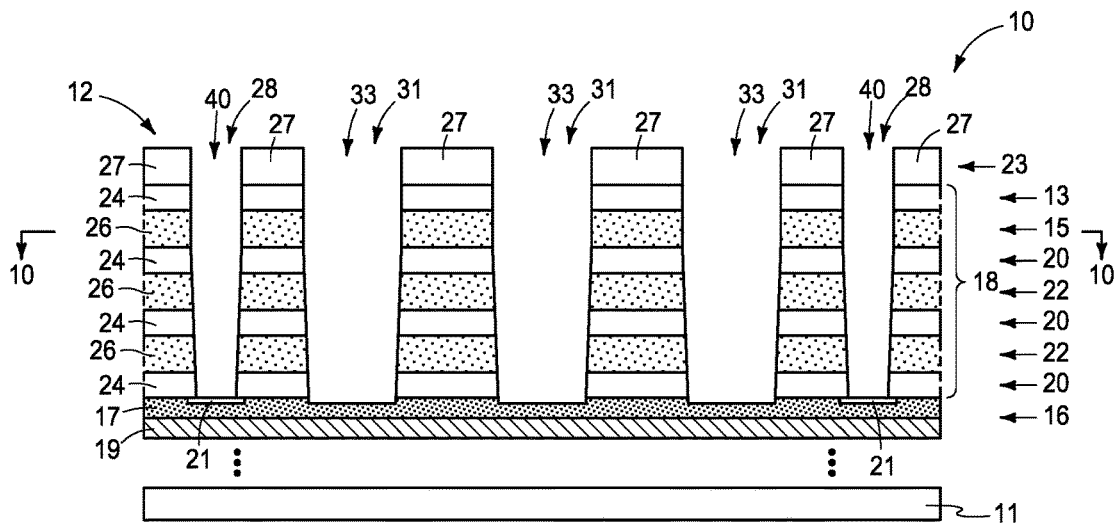
Figure 12:
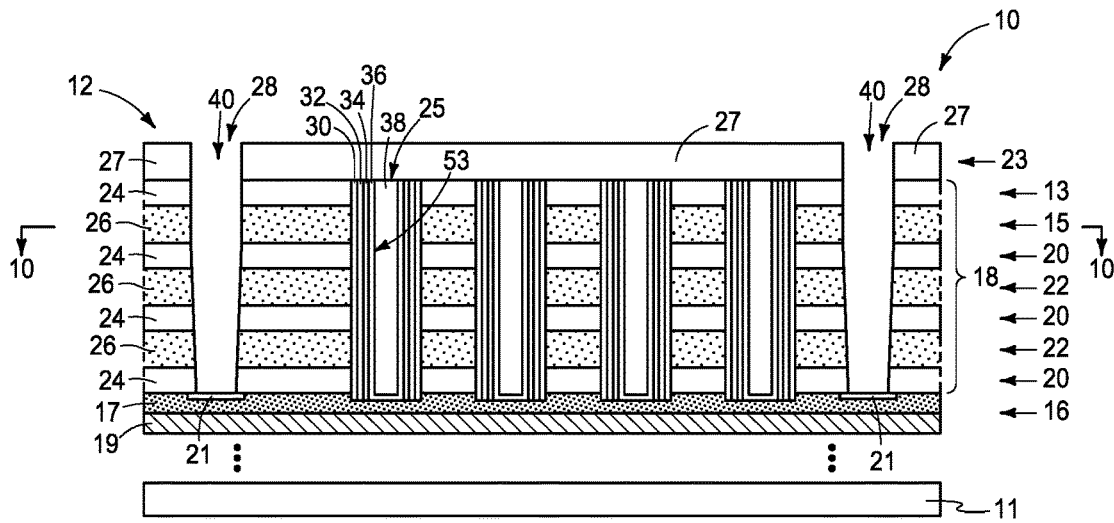

Referring to FIGS. 10-12, mask 23 has been used (e.g., as an etch mask) while etching unmasked portions of stack 18 through trench openings 28 and operative TAV openings 31 in mask 23 to form horizontally-elongated trench openings 40 in stack 18 and to form operative TAV openings 33 in stack 18. Ideally, at least TAV openings 33 extend at least to conductive tier 16. In one embodiment and as shown, the channel openings and the channel-material strings are formed through the insulative tiers and the wordline tiers before the etching exemplified by FIGS. 10-12. Alternately, such channel material openings and/or channel-material strings may be formed after such etching (not shown). Regardless, openings 40 and 33 may be inwardly or outwardly tapered, with slight inward tapering being shown. Alternately, by way of example, all of the sidewalls of openings 40 and 33 may be vertical.

In some embodiments, sacrificial plugs are formed in and removed from individual operative TAV openings 33 in stack 18 and in individual trench openings 40 in stack 18. Example such processing is next-described with reference to FIGS. 13-19.

Figure 13:
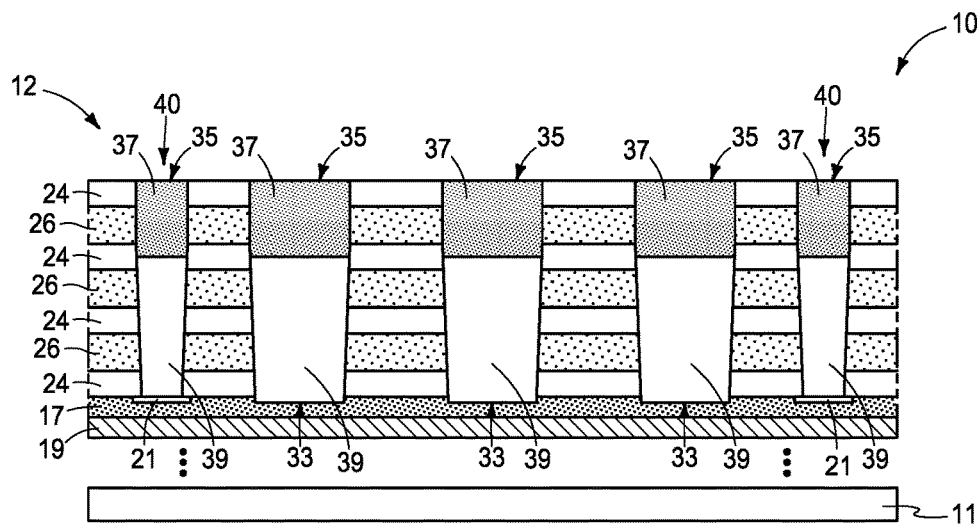

Referring to FIG. 13, mask 23 (not shown) has been removed. Sacrificial plugs 35 comprising material 37 have been formed in openings 33 and 40. Material 37 may be any of insulating, conductive, and/or semiconductive, with an example being $Al_2O_3$. Material 26 in tiers 15 and 22 may be laterally recessed before forming plugs 35 (not shown). Regardless, and in one embodiment and as shown, such sacrificial plugs less-than-fill openings 33 and 40 thereby leaving or comprising a void space 39 in such openings below such plugs. Alternately, and by way of example only, such sacrificial plugs could completely fill (not shown) the respective openings.

Figure 14:
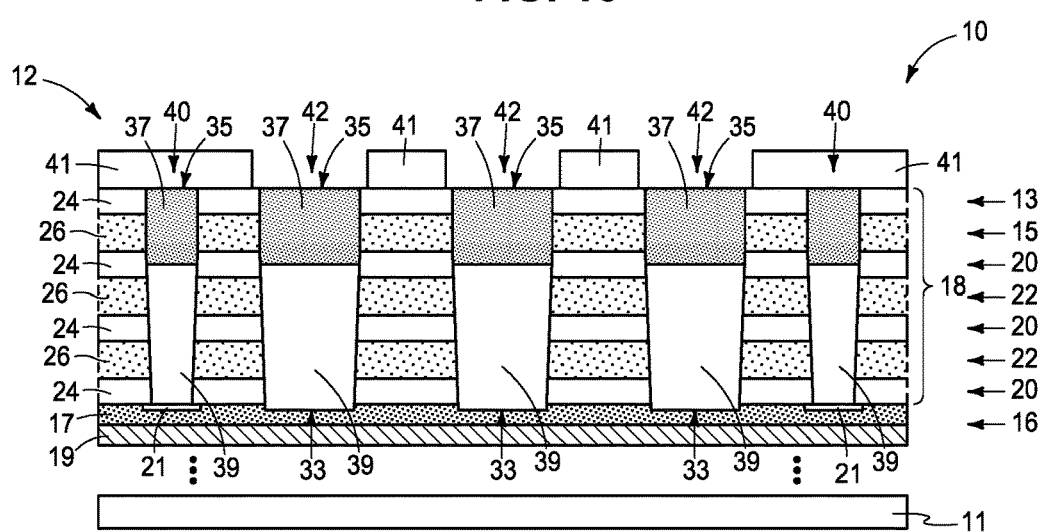

Referring to FIG. 14, sacrificial masking material 41 (e.g., carbon) has been formed atop stack 18 and comprises openings 42 there-through to sacrificial plugs 35 in operative TAV openings 33 while leaving sacrificial plugs 35 in trench openings 40 covered.

Figure 15:
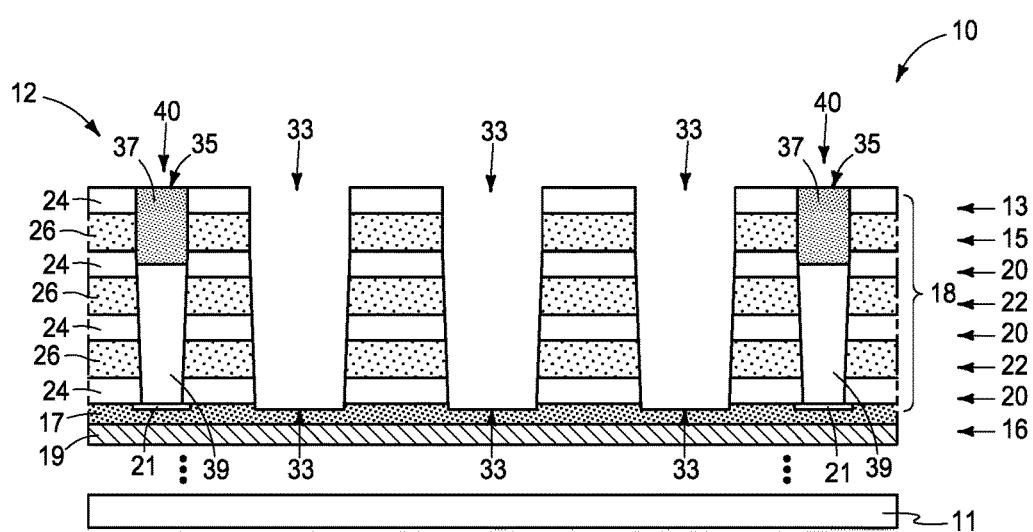

Referring to FIG. 15, exposed sacrificial plugs 35 in operative TAV openings 33 (not shown) have been removed followed by removing of sacrificial masking material 41 (not shown), leaving sacrificial plugs 35 in trench openings 40.

Figure 16:
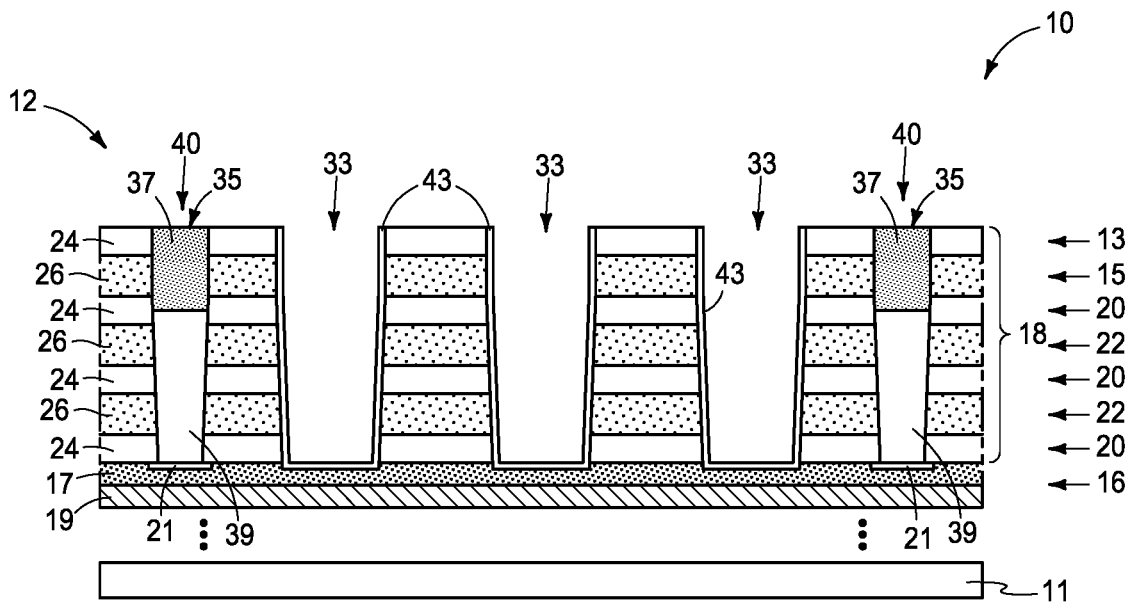

Referring to FIG. 16, an insulative lining 43 (e.g., silicon dioxide) has been formed within operative TAV openings 33.

Figure 17:
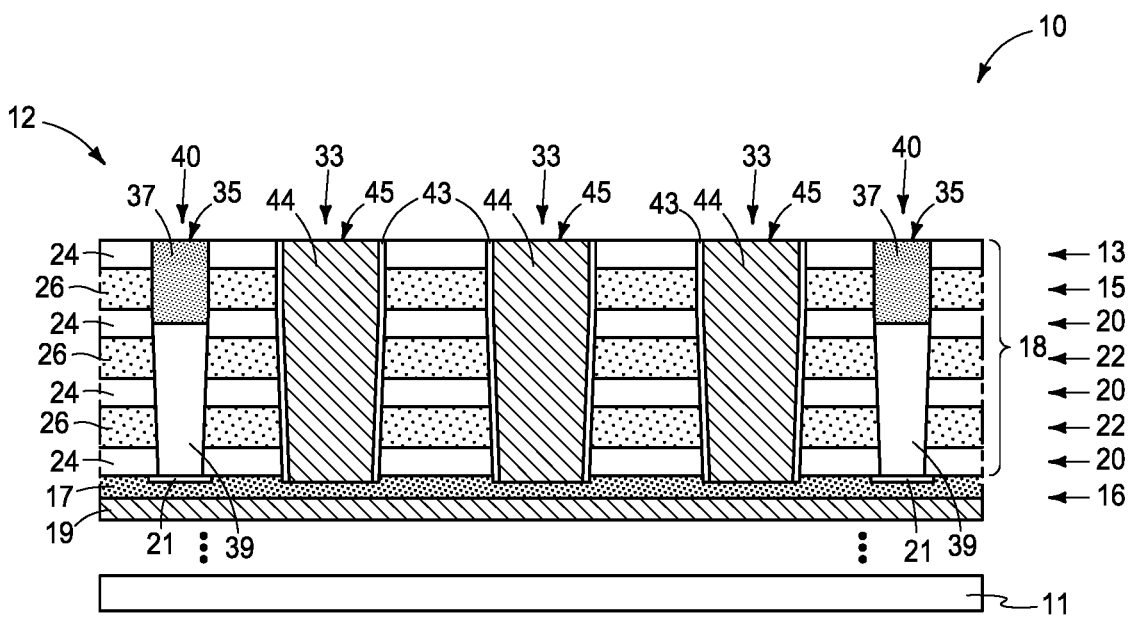

Referring to FIG. 17, insulative lining 43 has been subjected to a punch etch to expose conductive material 17 of conductive tier 16, followed by formation of conductive material 44 therein and planarizing such back at least to an elevationally outermost surface of uppermost insulating tier 13, thus forming an operative TAV 45 in individual operative TAV openings 33 in stack 18. In one embodiment and as shown, the forming of conductive material 44 in individual operative TAV openings 33 in stack 18 occurs while at least all of a lower half of individual trench openings 40 in stack 18 is completely occluded and, in one embodiment as shown, while all of individual trench openings 40 in stack 18 are completely occluded.

Figure 18:
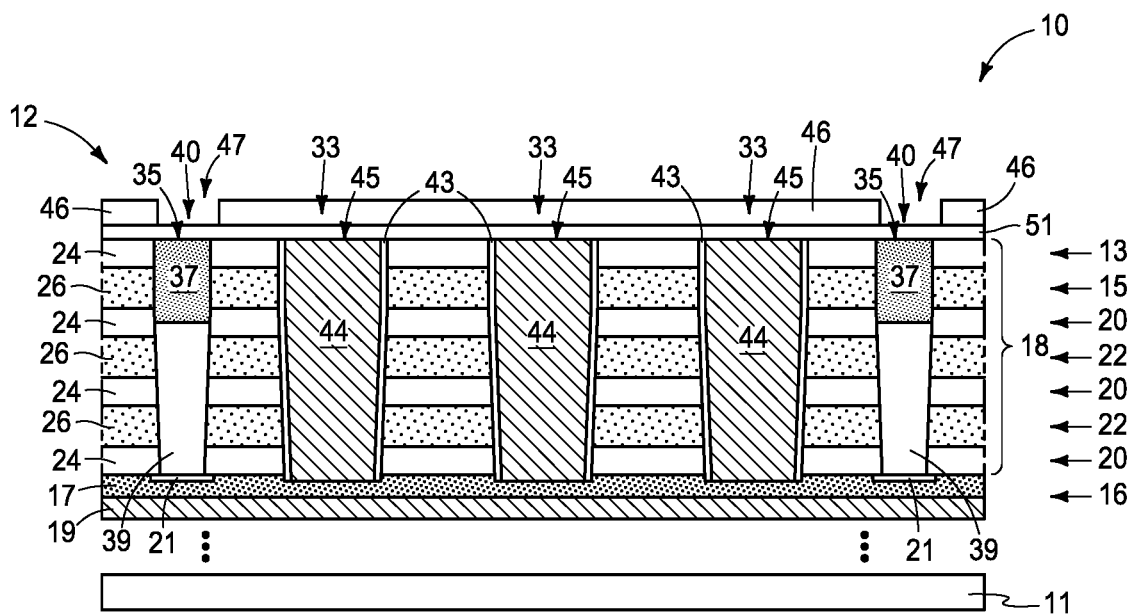

Referring to FIG. 18, an insulator material 51 (e.g., silicon dioxide) has been formed atop stack 18 and thereby comprises a part of uppermost insulating tier 13. A masking material 46 (e.g., carbon) has been formed thereover. Such has been formed to have mask openings 47 therein having a corresponding outline of trench openings 40 in stack 18. Openings 47 may be of the same lateral width (not shown) of or may be wider than (as shown) trench openings 40. Regardless and typically, openings 47 may be misaligned to at least one side relative to underlying trench openings 40 (misalignment to the right side being shown).

Figure 19:
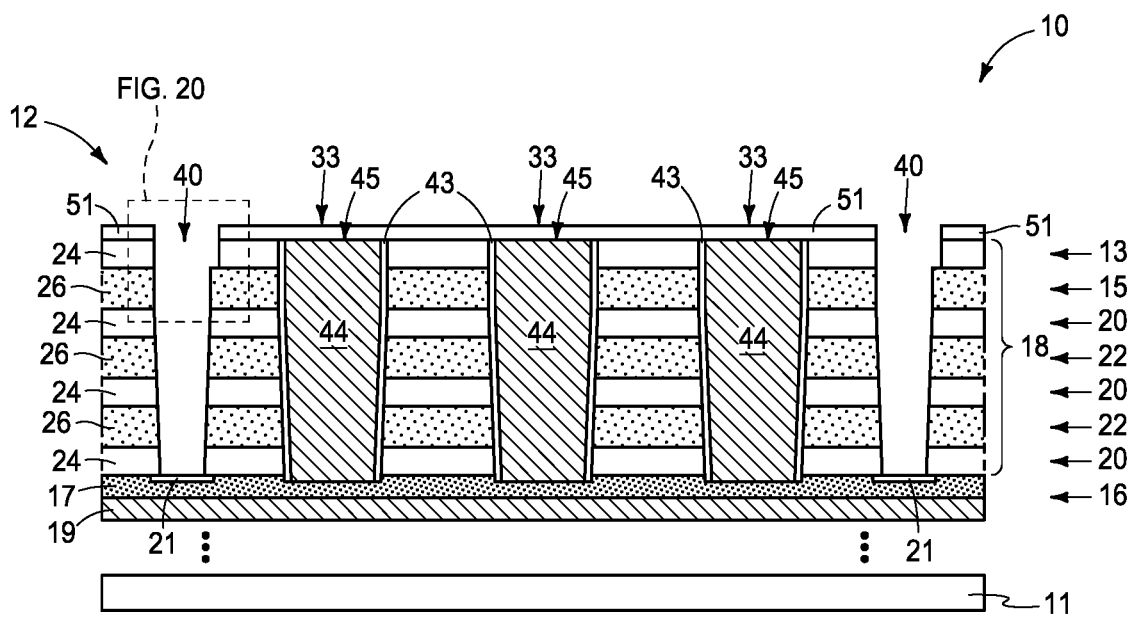
Figure 20:
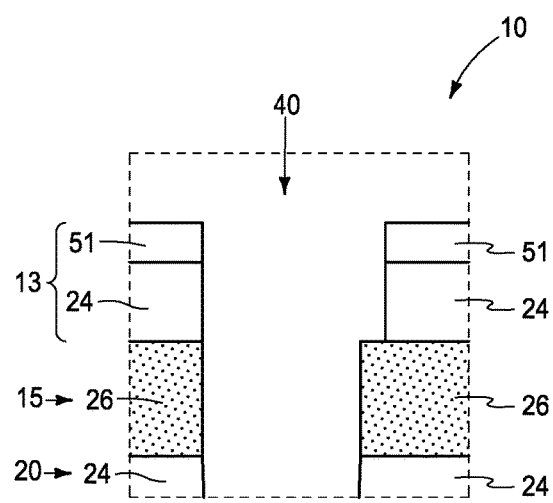

Referring to FIGS. 19 and 20, and in one embodiment, masking material 46 (not shown) has been used as a mask while etching insulator material 51 through openings 47 (not shown), and in one embodiment into uppermost insulating tier 13, and masking material 46 (not shown) has thereafter been removed as have sacrificial plugs 35 (not shown) from trench openings 40. In one example, etching may be conducted entirely through uppermost insulating tier 13 to material 26 of uppermost conductor tier 15.

Figure 20A:
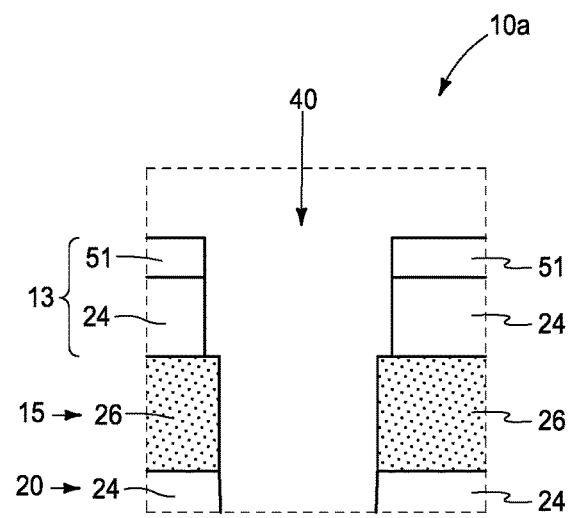
FIGS. 20A, 20B, 20C, 33A, 33B, 33C, and 34-42 are diagrammatic cross-sectional views of a portion of substrates in process in accordance with embodiments of the invention.
Figure 20B:
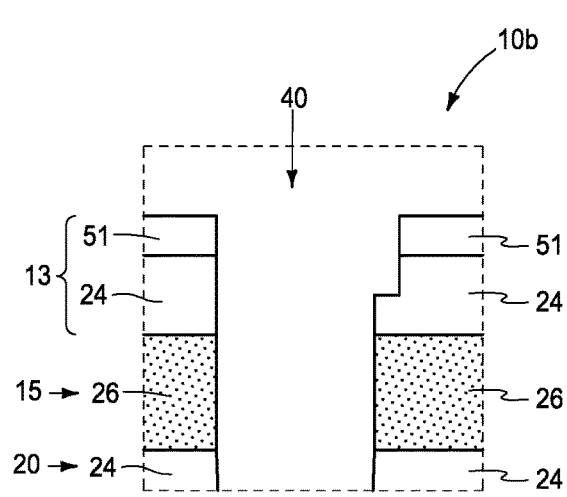
Figure 20C:
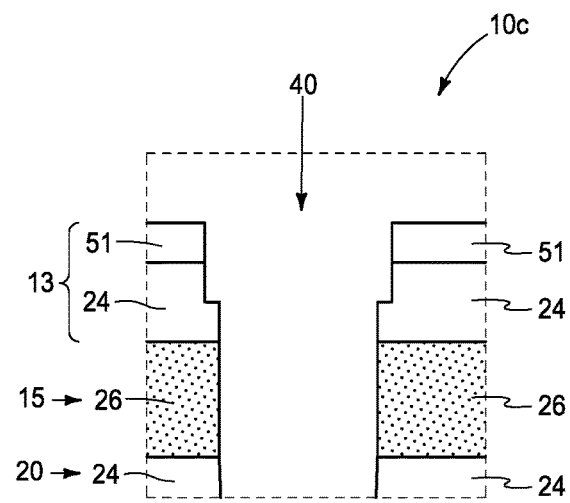

FIGS. 20A, 20B, and 20C show alternate example constructions 10a, 10b, 10c, respectively. Like numerals from the above-described embodiments have been used where appropriate, with some construction differences being indicated with the suffix "a", "b", and "c", respectively. Construction 10a in FIG. 20A is like that of FIG. 20 but for showing unlikely perfect left-right mask alignment of masking-material openings 47 (not shown) relative to trench openings 40. FIG. 20B shows a construction 10b having right mask misalignment the same as shown in FIG. 18, but where the subsequent etching has only occurred partially into uppermost insulating tier 13. FIG. 20C shows another alternate example construction 10c analogous to that of FIG. 20A where perfect left-right mask alignment of masking-material openings 47 (not shown) has occurred, and with only subsequent partial etching having been conducted into uppermost insulating tier 13 analogous to that shown in FIG. 20B.

Figure 21:
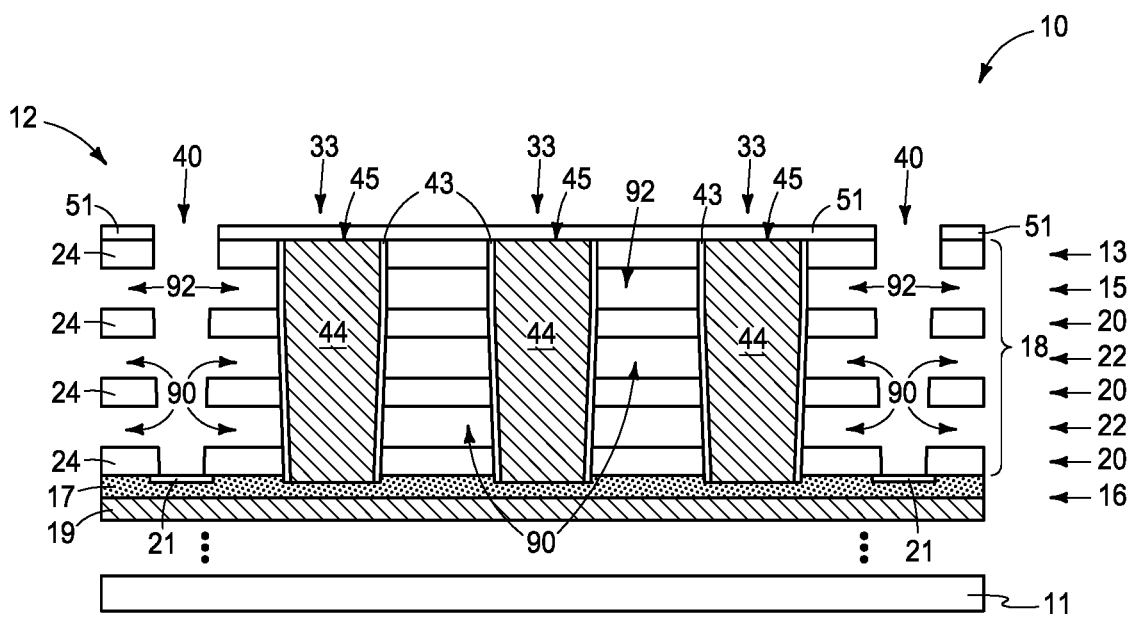
Figure 22:
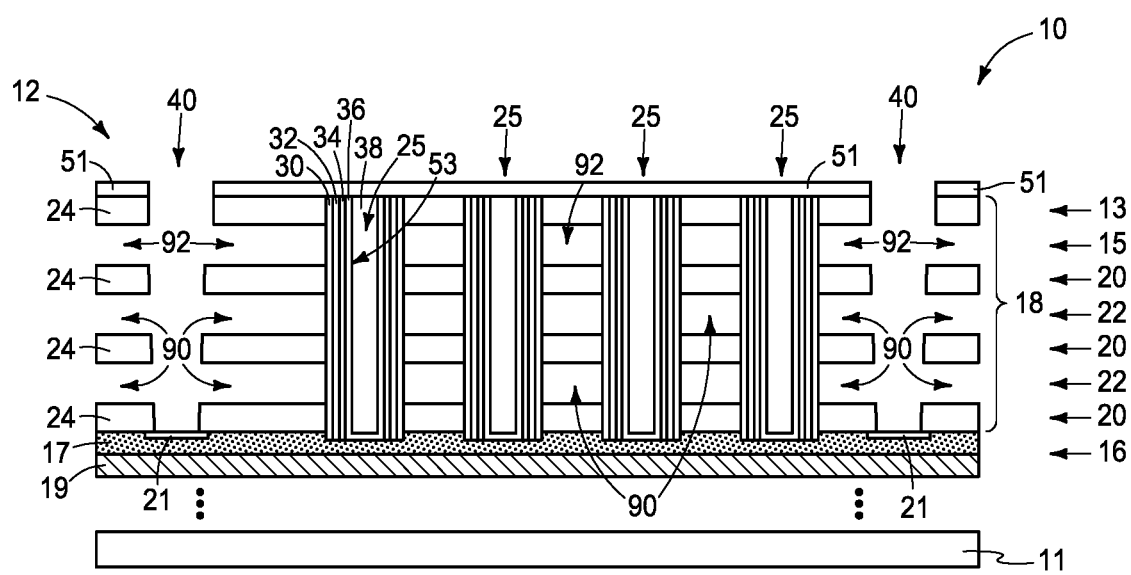

Referring to FIGS. 21 and 22, material 26 (not shown) of wordline tiers 22 and uppermost conductor tier 15 has been removed, for example by etching such selectively relative to materials 24, 30, 32, 34, 36, and 38 (e.g., using liquid or vapor $H_3PO_4$ as a primary etchant where material 26 is silicon nitride and material 24 is silicon dioxide). Such has formed wordline-tier voids 90 and an uppermost-conductor-tier void 92.

Figure 23:
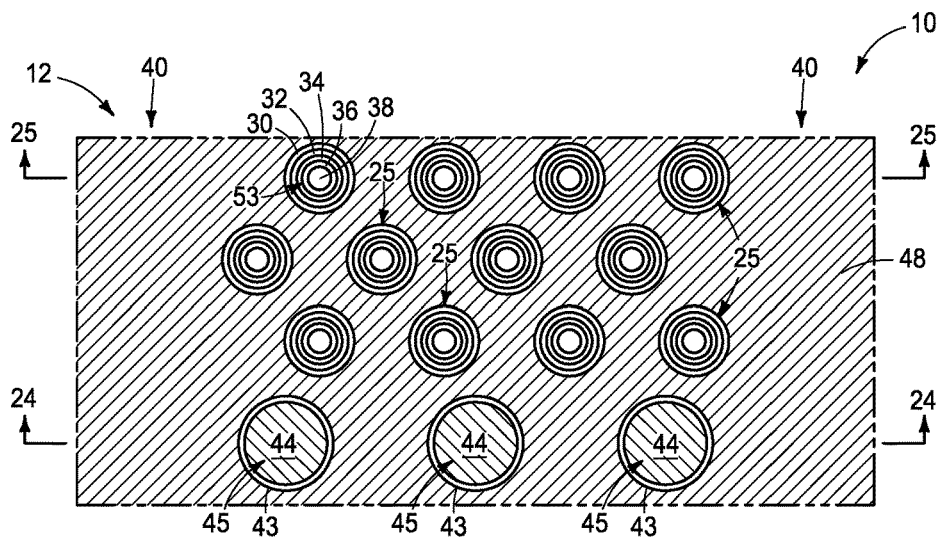
Figure 24:
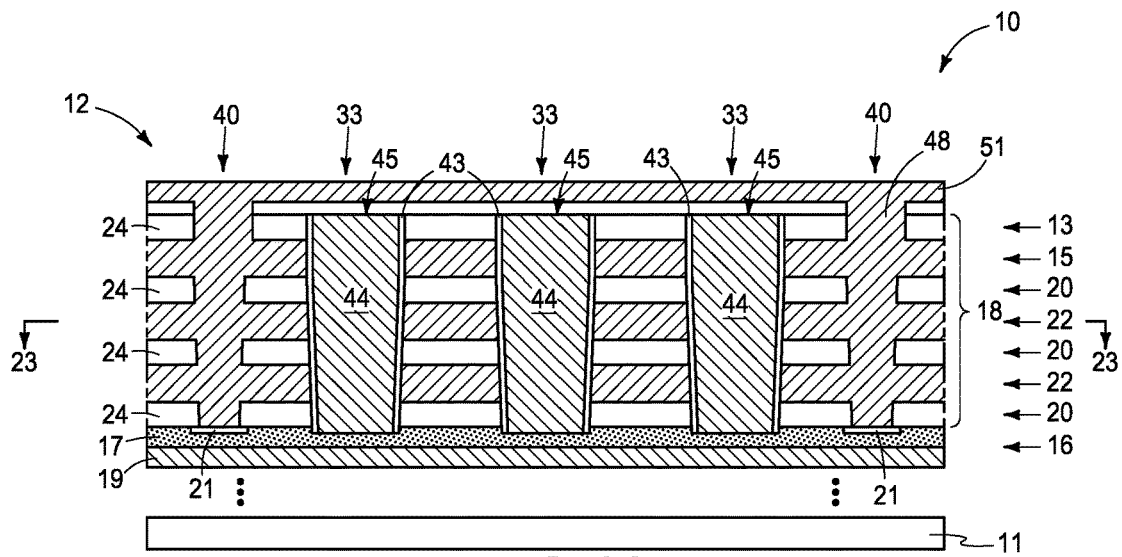
Figure 25:
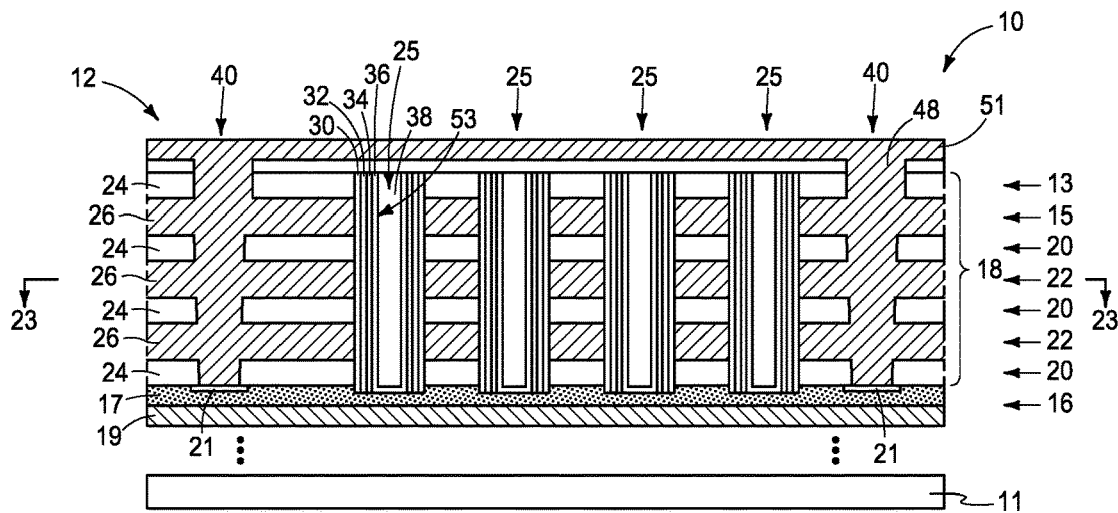
Figure 26:
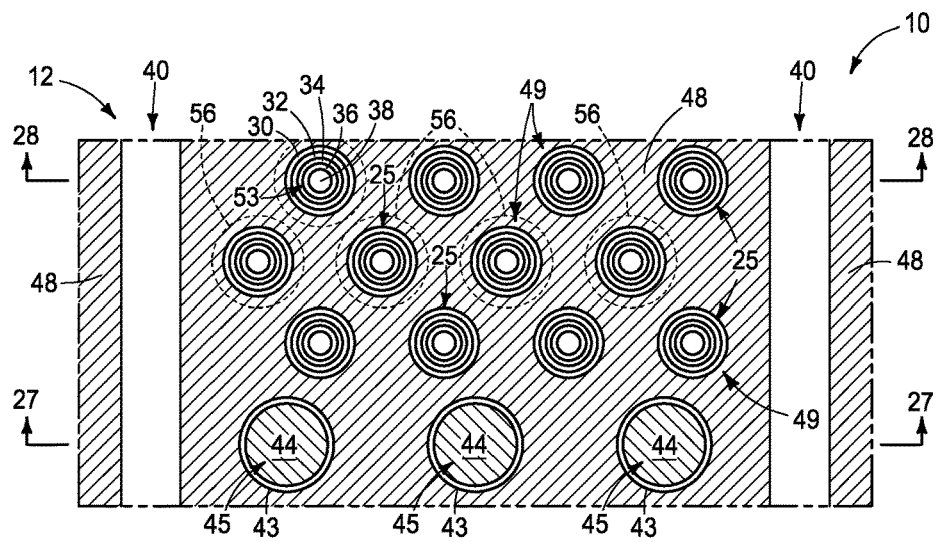
Figure 27:
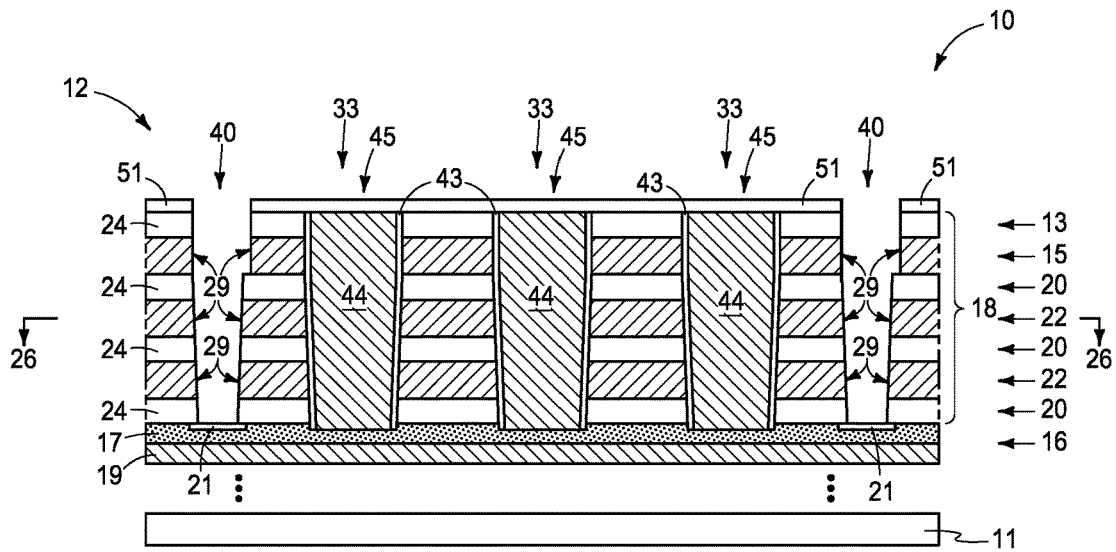
Figure 28:
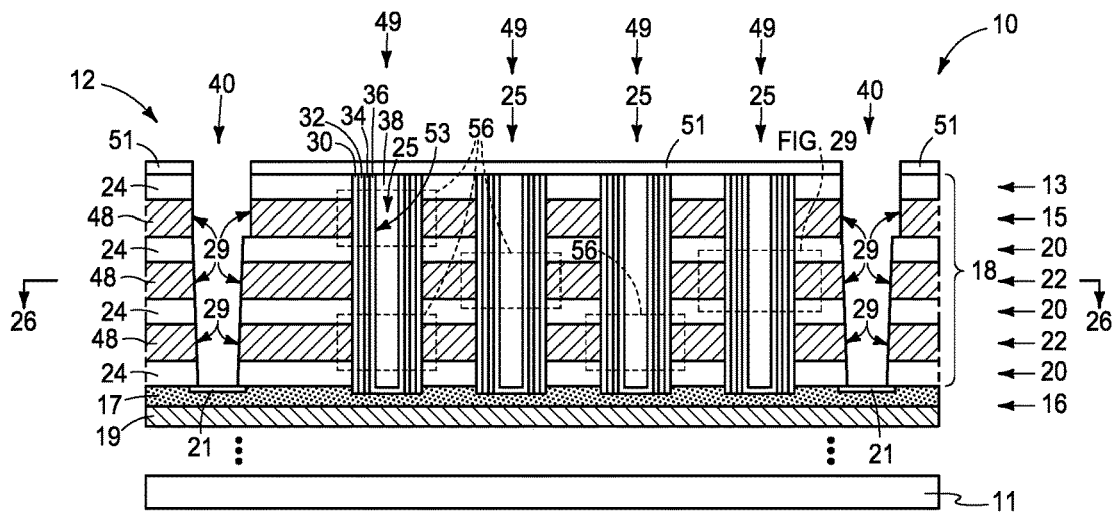
Figure 29:
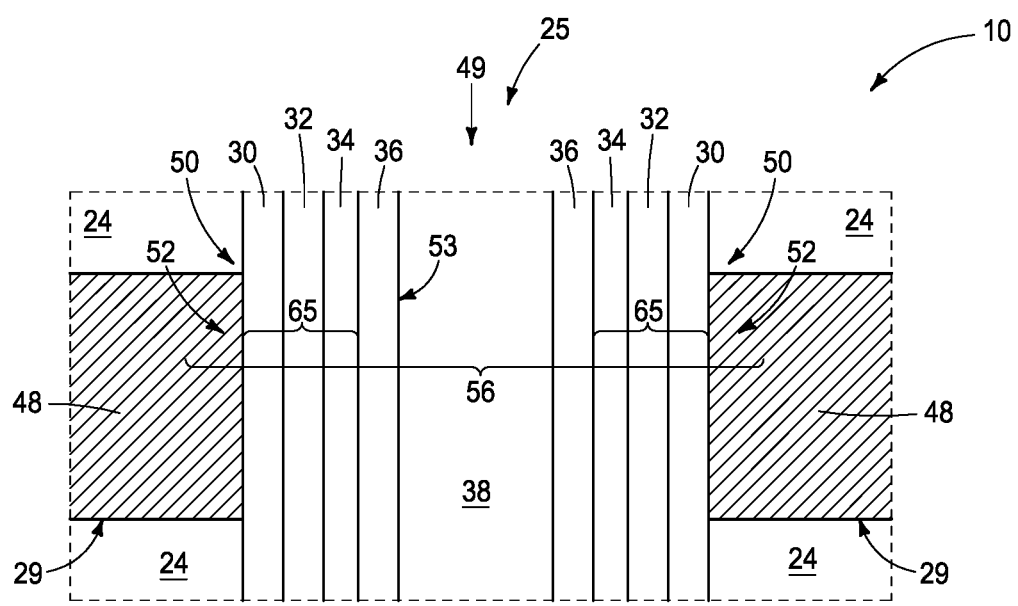
Figure 30:
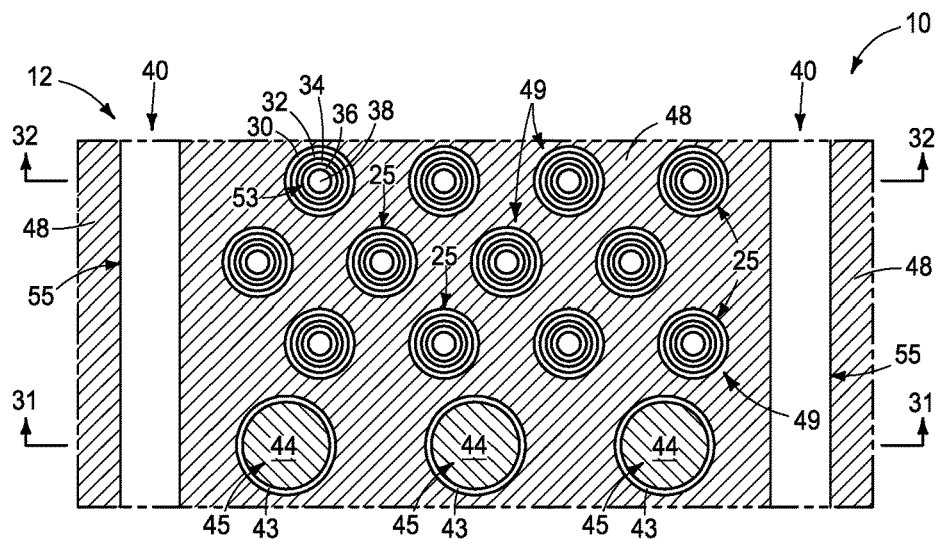
Figure 31:
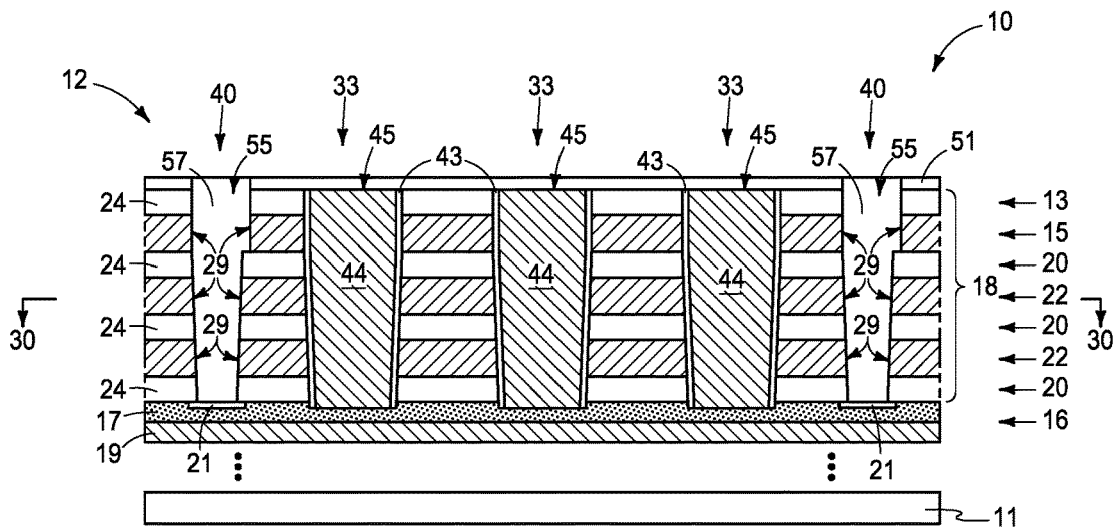
Figure 32:
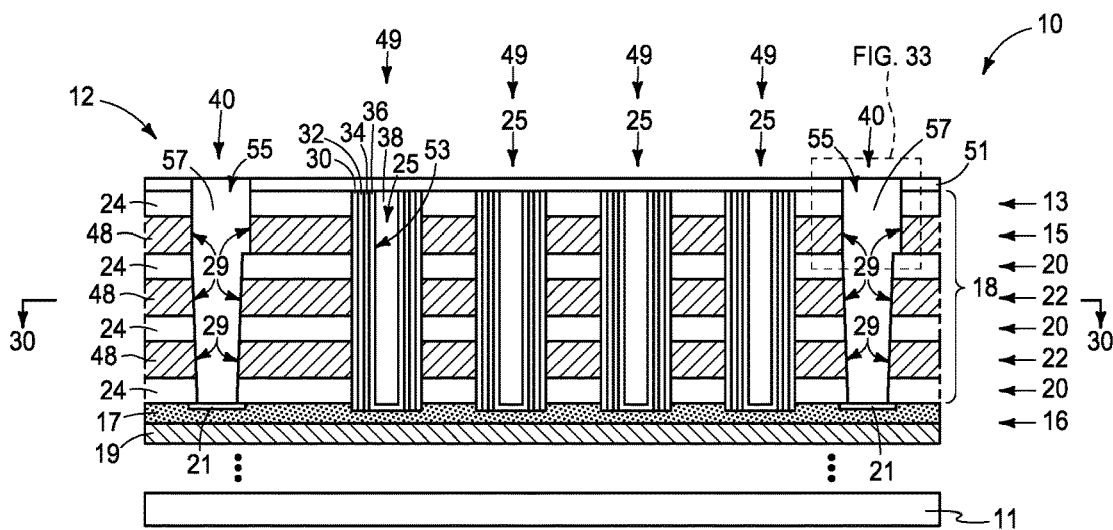

Referring to FIGS. 23-25, conducting material 48 has been formed through trenches 40 into the wordline-tier voids in wordline tiers 22 and into the uppermost-conductor-tier void in uppermost conductor tier 15. A thin insulating material liner (e.g., at least one of $Al_2O_3$ and $HfO_x$, and not shown) may be formed prior to formation of conducting material 48. Regardless, any suitable conducting material 48 may be used, for example one or both of metal material and conductively-doped semiconductive material. In but one example embodiment, conducting material 48 comprises a first-deposited conformal titanium nitride liner (not shown) followed by deposition of another composition metal material (e.g., elemental tungsten).

Referring to FIGS. 26-29, conducting material 48 has been removed from individual trenches 40. Such has resulted in formation of wordlines 29 and elevationally-extending strings 49 of individual transistors and/or memory cells 56. Approximate locations of transistors and/or memory cells 56 are indicated with a bracket in FIG. 29 and some with dashed outlines in FIGS. 26 and 28, with transistors and/or memory cells 56 being essentially ring-like or annular in the depicted example. Conducting material 48 may be laterally recessed relative to sidewalls of material 24 within trench openings 40 (not shown). Conducting material 48 may be considered as having terminal ends 50 (FIG. 29) corresponding to control-gate regions 52 of individual transistors and/or memory cells 56. Control-gate regions 52 in the depicted embodiment comprise individual portions of individual wordlines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Referring to FIGS. 30-33, a material 57 (dielectric and/or silicon-containing such as undoped polysilicon) has been formed in individual trenches 40, thus forming a wordline-intervening structure 55 (a structure between immediately-adjacent wordlines) in individual trench openings 40 in stack 18.

Any other attribute(s) or aspect(s) as shown and/or described herein with respect to other embodiments may be used with respect to the above-described embodiments.

The above processing is but one example and wherein conductive material 44 in individual operative TAV openings 33 in stack 18 is formed before forming wordline-intervening structures 55 in stack 18. Alternately, this could be reversed (not shown). The above processing is also but one example wherein sacrificial plugs 35 are formed in individual operative TAV openings 33 and in individual trench openings 40 at the same time and yet are removed at different time-spaced periods of time. Such depicted processing is also but one example embodiment of removing sacrificial plugs 35 from individual operative TAV openings 33 before removing sacrificial plugs 35 that are in individual trench openings 40, with the forming of conductive material 44 in individual operative TAV openings 33 occurring before removing sacrificial plugs 55 that are in trench openings 40. Alternately, this could be reversed (not shown). Any other attribute(s) or aspect(s) as shown and/or described herein with respect to other embodiments may be used.

In one embodiment, the mask (e.g., 23) comprising the horizontally-elongated trench openings (e.g., 28) and operative TAV openings (e.g., 31) may be formed to comprise dummy TAV openings. In the context of this document, a "dummy TAV opening" is an opening in which a dummy TAV is or will be formed in the stack, with a "dummy TAV" being a TAV in which no current ever flows there-through in a finished circuit construction and which may be a circuit inoperable dead end that is not part of a current flow path of a circuit even if extending to or from an electronic component. As an example, one or more of the depicted TAV openings 31 in FIGS. 7 and 8 could be a dummy TAV opening. Alternately, dummy TAV openings could be formed elsewhere among operative TAV openings and/or laterally outside of any wordline. Regardless, in such an embodiment, such etching of unmasked portions of stack 18 will then also be conducted through the dummy TAV openings thereby forming dummy TAV openings in stack 18. Dummy material is some time thereafter formed in individual of the dummy TAV openings in the stack. In this document, "dummy material" is a material in which no current ever flows there-through in the finished circuitry construction regardless of whether the dummy material is conductive, semiconductive, and/or insulative. In one embodiment, such dummy material may comprise conductive material 44 which is formed in the individual dummy TAV openings at the same time conductive material 44 is formed in the operative TAV openings in the stack. Alternately and as an example, the dummy material may not comprise such conductive material 44, with the forming of conductive material 44 in operative TAV openings 33 and the forming of dummy material in the individual dummy TAV openings in the stack occurring at different time-spaced periods of time. Either may be formed before the other, with in one embodiment conductive material 44 being formed in the individual operative TAV openings in stack 18 before forming the dummy material in the individual dummy TAV openings in the stack.

In one embodiment, memory array 12 is formed to comprise CMOS-under-array circuitry.

Some embodiments of the invention comprise forming a step atop or above an uppermost of the insulative tiers of the alternating insulative tiers and wordline tiers on at least one side of individual of the wordlines, with the wordline-intervening structure being atop such step. See for example FIGS. 31-33 processed in accordance with the above-described example embodiments. Such show formation of a step 59 (so designated only in FIG. 33 due to space constraint in FIGS. 31 and 32) atop uppermost insulative tier 20 in stack 18, with step 59 comprising insulative material 24 of such uppermost insulative tier 20. Step 59 may be elevationally recessed into such insulative material (not shown) or may comprise an uppermost surface of such insulative material as shown. Regardless, wordline-intervening structure 55 is atop step 59.

Figure 33:
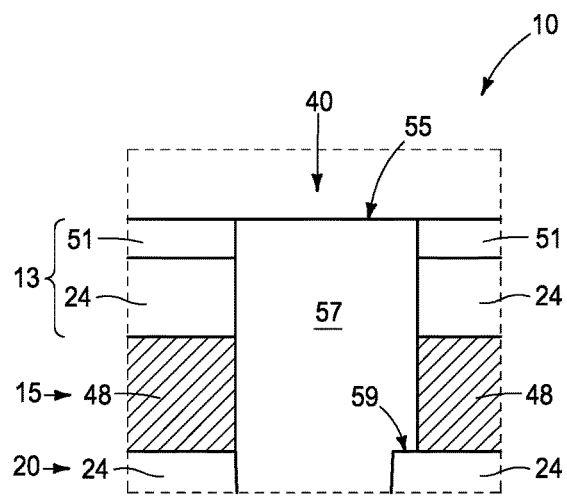
Figure 33A:
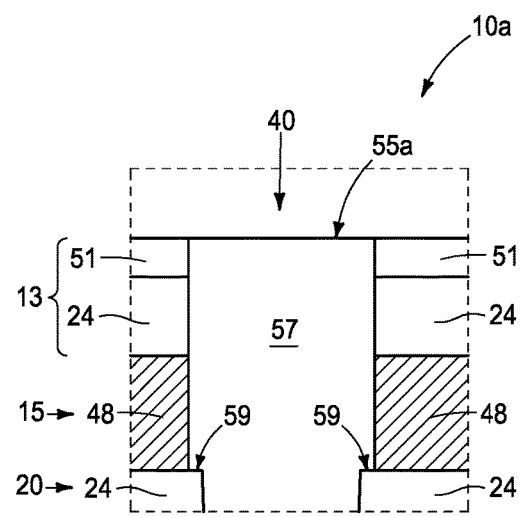
Figure 33B:
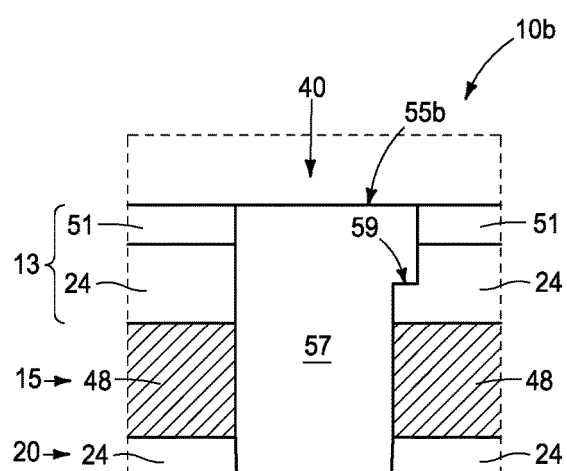
Figure 33C:
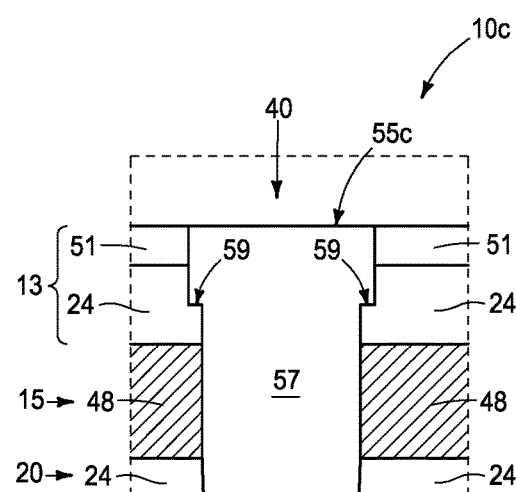

FIGS. 33A, 33B, and 33C show structures that may result from processing alternate constructions 10a, 10b, and 10c, respectively, as shown in FIGS. 20A, 20B, and 20C, respectively, and having one or more respective steps 59. Accordingly, in some embodiments, a step 59 is above uppermost insulative tier 20 and in some such embodiments is above uppermost conductor tier 15. In some such embodiments, the step is within insulating material of uppermost insulating tier 13. In one embodiment, the step is on only one side of individual wordlines 29 and in another embodiment is on both sides of individual wordlines 29. In some embodiments, the step is horizontal. Any other attribute(s) or aspect(s) as shown and/or described herein with respect to other embodiments may be used.

In some embodiments, the step is atop the uppermost conductor tier (not shown) and comprises conducting material of the conductor tier (not shown), for example as may occur in gate-first processing wherein sacrificial material 26 is not first-deposited. In such example embodiment, the step may comprise an uppermost surface of the conducting material of the conductor tier or may be recessed elevationally there-into. Any other attribute(s) or aspect(s) as shown and/or described herein with respect to other embodiments may be used.

Some embodiments of the invention comprise forming the wordline-intervening structure to comprise opposing laterally-outer longitudinal edges at least some of each of which above the uppermost conductor tier are less overall steep than the opposing laterally-outer longitudinal edges below the uppermost conductor tier. A first example such embodiment is described with reference to FIGS. 34 and 35 with respect to a construction 10d. Like numerals from the above-described embodiments have been used where appropriate, with some construction differences being indicated with the suffix "d" or with different numerals.

Figure 34:
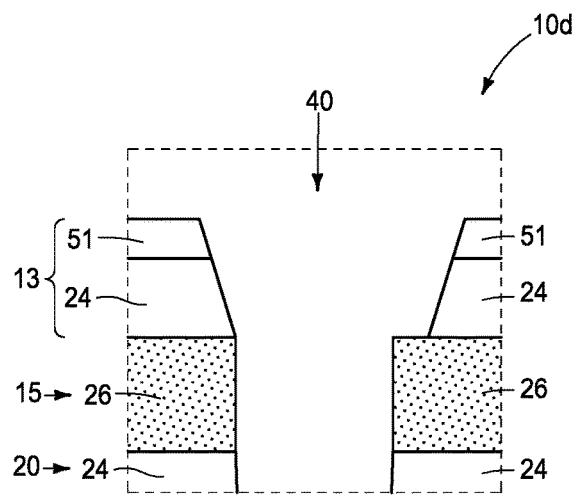

Referring to FIG. 34, such shows a structure in processing sequence the same as that shown by FIG. 20 in the first-described embodiments. Tapered/sloped sidewalls of materials 51 and 24 of uppermost insulating tier 13 have been formed and which are less overall steep than below uppermost conductor tier 15. Such may result from using wider mask openings 47 (in FIG. 18), misaligned to the right, and as an artifact of etching to form opening 40. Alternately, such can result from changing etching power and/or etching chemistry to introduce a degree of isotropy into the act of etching regardless of whether using wider mask openings than that shown in FIG. 18.

Figure 35:
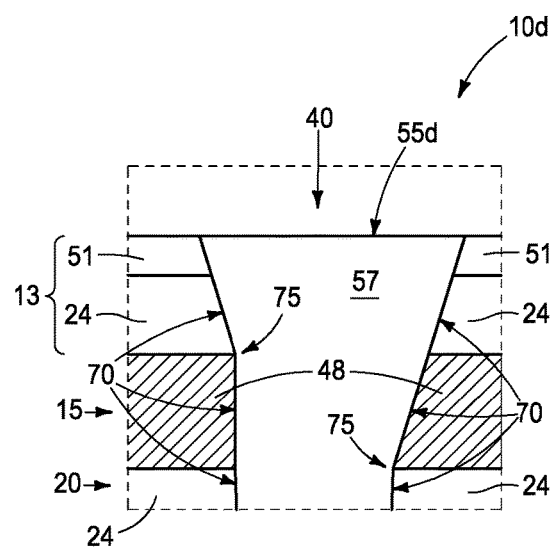

FIG. 35 shows example subsequent processing having occurred through and according with that shown by FIG. 33 in the first-described embodiments yet whereby a wordline-intervening structure 55d has been formed. Such comprises opposing laterally-outer longitudinal edges 70. At least some of each of opposing laterally-outer longitudinal edges 70 above uppermost conductor tier 15 are less overall steep than the opposing laterally-outer longitudinal edges 70 below uppermost conductor tier 15. Any other attribute(s) or aspect(s) as shown and/or described herein with respect to other embodiments may be used.

Figure 42:
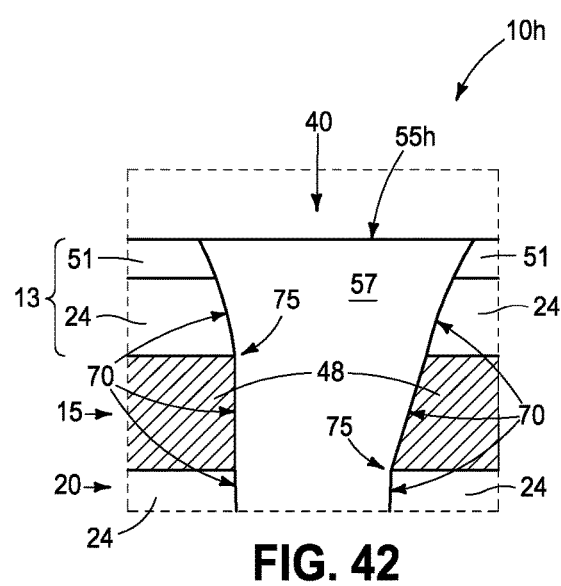

In one embodiment and as shown, the at least some (e.g., all as shown) of each of opposing laterally-outer longitudinal edges 70 above uppermost conductor tier 15 has constant slope (rise over run) above uppermost conductor tier 15. Alternately, for example, at least some of each of opposing laterally-outer longitudinal edges 70 above uppermost conductor tier 15 may not have constant slope, for example as shown with respect to an alternate embodiment construction 10h in FIG. 42. Like numerals from the above-described embodiments have been used where appropriate, with some construction differences being indicated with the suffix "h". Such shows an example wherein each of opposing laterally-outer longitudinal edges 70 above uppermost conductor tier 15 are convexly curved relative to opening 40. Any other attribute(s) or aspect(s) as shown and/or described herein with respect to other embodiments may be used.

FIG. 35 also shows an example embodiment wherein each of opposing laterally-outer longitudinal edges 70 on each side has a respective lowest location 75 where steepness changes to a different and constant steepness below lowest location 75, with lowest location 75 on each side being at different elevations relative one another (e.g., left-side location 75 is higher than right-side location 75). This may result from mask misalignment left or right of mask openings 47 in masking material 46 as exemplified in FIG. 18. Any other attribute(s) or aspect(s) as shown and/or described herein with respect to other embodiments may be used.

Figure 36:
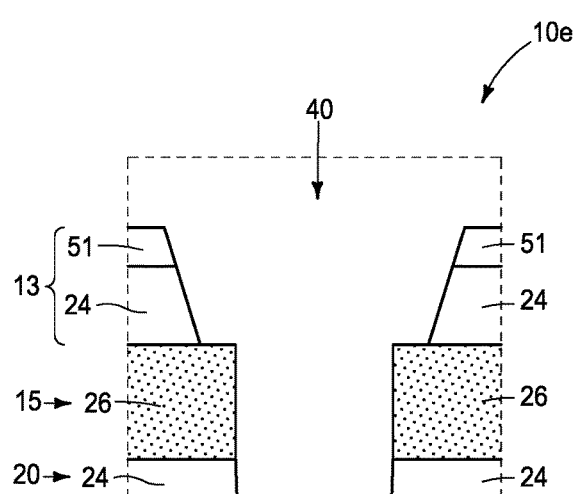
Figure 37:
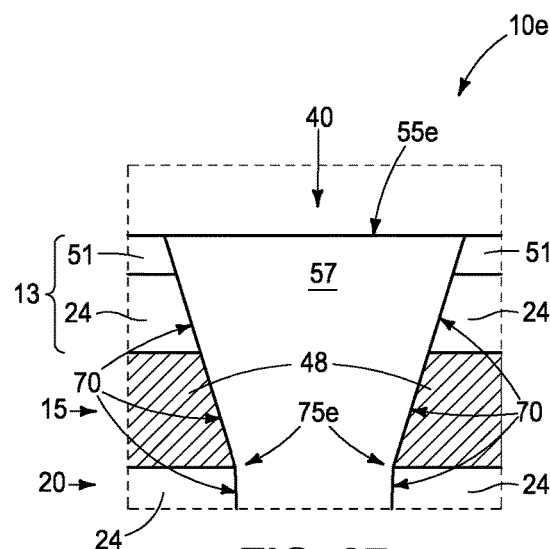

FIGS. 36 and 37 show an alternate example construction 10e. Like numerals from the above-described embodiments have been used where appropriate, with some construction differences being indicated with the suffix "e". FIGS. 36 and 37 show perfect left-right mask alignment whereby, for example, lowest locations 75e on each side of wordline-intervening structure 55e are at the same elevation relative one another. Any other attribute(s) or aspect(s) as shown and/or described herein with respect to other embodiments may be used.

Figure 38:
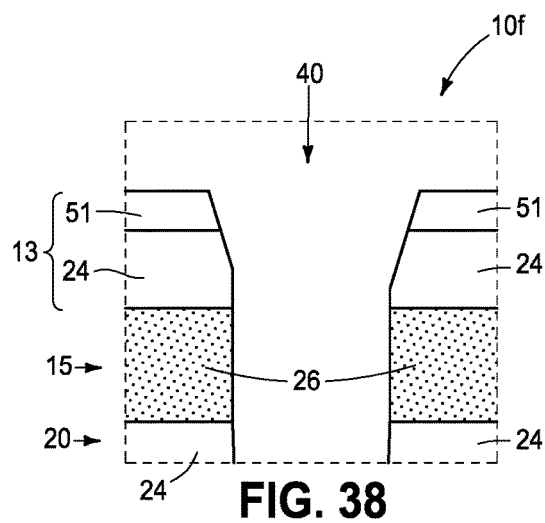
Figure 39:
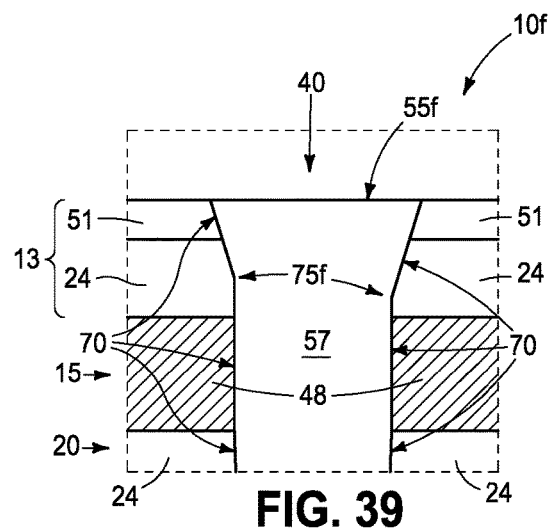
Figure 40:
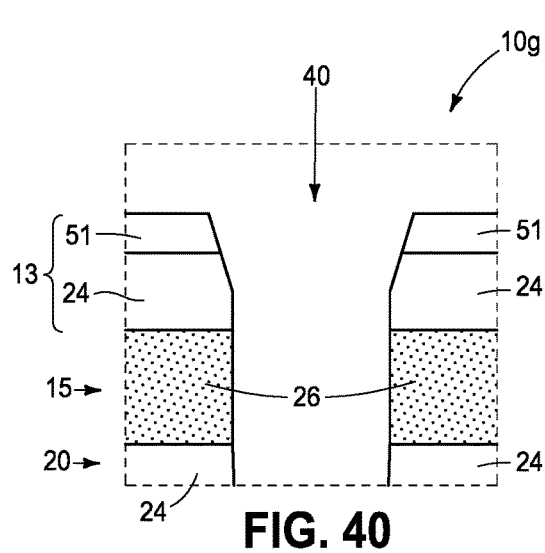
Figure 41:
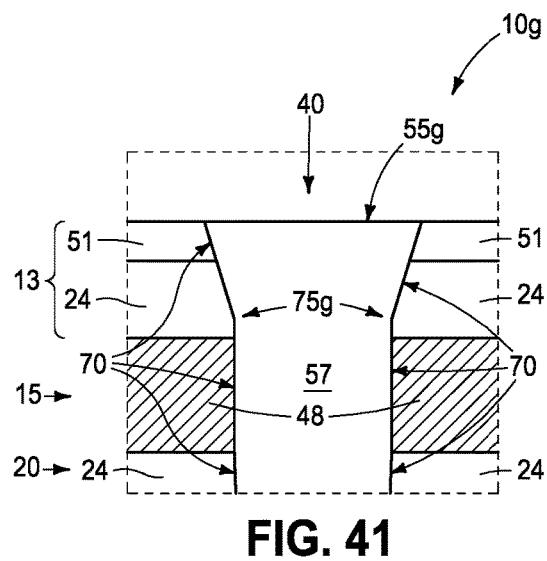

FIGS. 38, 39 and FIGS. 40, 41 show analogous alternate embodiment constructions 10f and 10g, respectively. Like numerals from the above-described embodiments have been used where appropriate, with some construction differences being indicated with the suffix "f" and "g", respectively. FIGS. 38 and 39 show an example embodiment wherein slight mask misalignment to the right has occurred, and with lowest locations 75f of structure 55f being within uppermost insulating tier 13 and at different elevations relative one another. FIGS. 40 and 41 show an alternate example embodiment wherein perfect mask alignment has occurred, with lowest locations 75g of structure 55g being within uppermost insulating tier 13 and at the same elevation relative one another. Any other attribute(s) or aspect(s) as shown and/or described herein with respect to other embodiments may be used.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments. Memory array embodiments may result from artifact(s) of manufacture and, regardless, may or may not have a change (e.g., improvement) in operation compared to predecessor construction(s) that is/are not in accordance with the invention(s).

An embodiment of the invention comprises a memory array (e.g., 12) comprising a vertical stack (e.g., 18) comprising an uppermost insulating tier (e.g., 13), an uppermost conductor tier (e.g., 15) below the insulating tier, and alternating insulative tiers (e.g., 20) and wordline tiers (e.g., 22) below the uppermost conductor tier. The wordline tiers comprise gate regions (e.g., 52) of individual memory cells (e.g., 56). The gate regions individually comprise part of a wordline (e.g., 29) in individual of the wordline tiers. Channel-material strings (e.g., 53) extend elevationally through the insulative tiers and the wordline tiers. The individual memory cells comprise a memory structure (e.g., 65) laterally between individual of the gate regions and channel material (e.g., 36) of the channel-material strings. A wordline-intervening structure (e.g., 55, 55a, 55b, 55c) extends through the stack between immediately-adjacent wordlines. A step (e.g., 59) is atop or above an uppermost of the insulative tiers on at least one side of the individual wordlines. The wordline-intervening structure is atop the step. Any other attribute(s) or aspect(s) as shown and/or described herein with respect to other embodiments may be used.

In some embodiments, a memory array (e.g., 12) comprises a vertical stack (e.g., 18) comprising an uppermost insulating tier (e.g., 13), an uppermost conductor tier (e.g., 15) below the insulating tier, and alternating insulative tiers (e.g., 20) and wordline tiers (e.g., 22) below the uppermost conductor tier. The wordline tiers comprise gate regions (e.g., 52) of individual memory cells (e.g., 56). The gate regions individually comprise part of a wordline (e.g., 29) in individual of the wordline tiers. Channel-material strings (e.g., 53) extend elevationally through the insulative tiers and the wordline tiers. The individual memory cells comprise a memory structure (e.g., 65) laterally between individual of the gate regions and channel material (e.g., 36) of the channel-material strings. A wordline-intervening structure (e.g., 55d, 55e, 55f, 55g, 55h)) extends through the stack between immediately-adjacent wordlines. The wordline-intervening structure comprises opposing laterally-outer longitudinal edges (e.g., 70). At least some of each of the opposing laterally-outer longitudinal edges above the uppermost conductor tier is less overall steep than the opposing laterally-outer longitudinal edges below the uppermost conductor tier. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS-under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array and conductive through-array-vias (TAVs) comprises forming a stack comprising vertically-alternating insulative tiers and wordline tiers. A mask is formed comprising horizontally-elongated trench openings and operative TAV openings above the stack. Etching is conducted of unmasked portions of the stack through the trench and operative TAV openings in the mask to form horizontally-elongated trench openings in the stack and to form operative TAV openings in the stack. Conductive material is formed in the operative TAV openings in the stack to form individual operative TAVs in individual of the operative TAV openings in the stack. A wordline-intervening structure is formed in individual of the trench openings in the stack.

In some embodiments, a method used in forming a memory array and conductive through-array-vias (TAVs) comprises forming a stack comprising an uppermost conductor tier and vertically-alternating insulative tiers and wordline tiers. The uppermost conductor tier and wordline tiers comprise a first material and the insulative tiers comprise a second material of different composition from that of the first material. Channel-material strings are formed through the insulative tiers and the wordline tiers. A mask is formed comprising horizontally-elongated trench openings and operative TAV openings above the stack. Etching is conducted of unmasked portions of the stack through the trench and operative TAV openings in the mask to form horizontally-elongated trench openings in the stack and to form operative TAV openings in the stack. Conductive material is formed in the operative TAV openings in the stack to form individual operative TAVs in individual of the operative TAV openings in the stack. The first material is removed after forming the conductive material in the operative TAV openings in the stack to form wordline-tier voids and an uppermost-conductor-tier void. Conducting material is formed in the wordline-tier voids to comprise the individual wordlines and in the uppermost-conductor-tier void. After forming the conducting material, a wordline-intervening structure is formed in individual of the trench openings in the stack.

In some embodiments, a memory array comprises a vertical stack comprising an uppermost insulating tier, an uppermost conductor tier below the insulating tier, and alternating insulative tiers and wordline tiers below the uppermost conductor tier. The wordline tiers comprise gate regions of individual memory cells and the gate regions individually comprise part of a wordline in individual of the wordline tiers. Channel-material strings extend elevationally through the insulative tiers and the wordline tiers. The individual memory cells comprise a memory structure laterally between individual of the gate regions and channel material of the channel-material strings. A wordline-intervening structure extends through the stack between immediately-adjacent of the wordlines. A step is atop or above an uppermost of the insulative tiers of the alternating insulative tiers and wordline tiers on at least one side of individual of the wordlines. The wordline-intervening structure is atop the step.

In some embodiments, a memory array comprises a vertical stack comprising an uppermost insulating tier, an uppermost conductor tier below the insulating tier, and alternating insulative tiers and wordline tiers below the uppermost conductor tier. The wordline tiers comprise gate regions of individual memory cells and the gate regions individually comprise part of a wordline in individual of the wordline tiers. Channel-material strings extend elevationally through the insulative tiers and the wordline tiers. The individual memory cells comprise a memory structure laterally between individual of the gate region and channel material of the channel-material strings. A wordline-intervening structure extends through the stack between immediately-adjacent of the wordlines. The wordline-intervening structure comprises opposing laterally-outer longitudinal edges and at least some of each of the opposing laterally-outer longitudinal edges is above the uppermost conductor tier and is less overall steep than the opposing laterally-outer longitudinal edges below the uppermost conductor tier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:
1. A method used in forming a memory array and conductive through-array-vias (TAVs), comprising:
   forming a stack comprising vertically-alternating insulative tiers and wordline tiers;
   forming a mask comprising horizontally-elongated trench openings and operative TAV openings above the stack;
   etching unmasked portions of the stack through the trench and operative TAV openings in the mask to form horizontally-elongated trench openings in the stack and to form operative TAV openings in the stack;

forming conductive material in the operative TAV openings in the stack to form individual operative TAVs in individual of the operative TAV openings in the stack; and forming a wordline-intervening structure in individual of the trench openings in the stack.

2. The method of claim 1 comprising forming channel-material strings through the insulative tiers and the wordline tiers before the etching.

3. The method of claim 1 comprising forming channel-material strings through the insulative tiers and the wordline tiers after the etching.

4. The method of claim 1 comprising forming the conductive material in the individual operative TAV openings in the stack before forming the wordline-intervening structures in the stack.

5. The method of claim 1 comprising forming the wordline-intervening structures in the stack before forming the conductive material in the individual operative TAV openings in the stack.

6. The method of claim 1 comprising:
forming the mask to comprise dummy TAV openings;
the etching also forming dummy TAV openings in the stack; and
forming dummy material in individual of the dummy TAV openings in the stack.

7. The method of claim 6 wherein,
the dummy material comprises the conductive material; and
the forming the conductive material in the individual operative TAV openings in the stack and in the individual dummy TAV openings in the stack occurs at the same time.

8. The method of claim 6 wherein,
the dummy material does not comprise the conductive material; and
the forming the conductive material in the individual operative TAV openings in the stack and the forming the dummy material in the individual dummy TAV openings in the stack occur at different time-spaced periods of time.

9. The method of claim 8 comprising forming the conductive material in the individual operative TAV openings in the stack before forming the dummy material in the individual dummy TAV openings in the stack.

10. The method of claim 1 comprising before forming the conductive material in the individual operative TAV openings in the stack and before forming the wordline-intervening structures in the stack, forming and removing sacrificial plugs in the individual operative TAV openings in the stack and in the individual trench openings in the stack.

11. The method of claim 10 wherein the sacrificial plugs in the individual operative TAV openings in the stack and in the individual trench openings in the stack less-than-fill the individual operative TAV openings in the stack and less-than-fill the individual trench openings in the stack thereby comprising a void space below individual of the sacrificial plugs in the individual operative TAV openings and in the individual trench openings in the stack.

12. The method of claim 10 wherein the sacrificial plugs in the individual operative TAV openings in the stack and in the individual trench openings in the stack completely fill the individual operative TAV openings in the stack and completely fill the individual trench openings in the stack.

13. The method of claim 10 wherein the sacrificial plugs in the individual operative TAV openings in the stack and in the individual trench openings in the stack are formed at the same time and are removed at different time-spaced periods of time.

14. The method of claim 10 comprising removing the sacrificial plugs from the individual operative TAV openings in the stack before removing the sacrificial plugs in the individual trench openings in the stack, the forming of the conductive material in the individual operative TAV openings in the stack occurring before removing the sacrificial plugs in the individual trench openings in the stack.

15. The method of claim 1 wherein the stack comprises an uppermost conductor tier and further comprising:
forming a step atop or above an uppermost of the insulative tiers on at least one side of individual wordlines, the wordline-intervening structure being atop the step.

16. The method of claim 1 wherein the stack comprises an uppermost conductor tier and further comprising:
forming the wordline-intervening structure to comprise opposing laterally-outer longitudinal edges, at least some of each of the opposing laterally-outer longitudinal edges above the uppermost conductor tier being less overall steep than the opposing laterally-outer longitudinal edges below the uppermost conductor tier.

17. The method of claim 1 wherein the etching is conducted in a single etching step.

18. A method used in forming a memory array and conductive through-array-vias (TAVs), comprising:
forming a stack comprising an uppermost conductor tier and vertically-alternating insulative tiers and wordline tiers, the uppermost conductor tier and wordline tiers comprising a first material, the insulative tiers comprising a second material of different composition from that of the first material;
forming channel-material strings through the insulative tiers and the wordline tiers;
forming a mask comprising horizontally-elongated trench openings and operative TAV openings above the stack;
etching unmasked portions of the stack through the trench and operative TAV openings in the mask to form horizontally-elongated trench openings in the stack and to form operative TAV openings in the stack;
forming conductive material in the operative TAV openings in the stack to form individual operative TAVs in individual of the operative TAV openings in the stack;
removing the first material after forming the conductive material in the operative TAV openings in the stack to form wordline-tier voids and an uppermost-conductor-tier void;
forming conducting material in the wordline-tier voids to comprise individual wordlines and in the uppermost-conductor-tier void; and
after forming the conducting material, forming a wordline-intervening structure in individual of the trench openings in the stack.

19. The method of claim 18 wherein the forming of the conductive material in the individual operative TAV openings in the stack occurs while at least all of a lower half of individual of the trench openings in the stack is completely occluded.

20. The method of claim 19 wherein the forming of the conductive material in the individual operative TAV openings in the stack occurs while all of individual of the trench openings in the stack are completely occluded.

21. The method of claim 20 wherein the forming of the conductive material in the individual operative TAV openings in the stack occurs while less-than-all of the individual trench openings in the stack are completely filled with sacrificial material thereby comprising a void space below the sacrificial material in the individual trench openings in the stack.

22. The method of claim 20 wherein the forming of the conductive material in the individual operative TAV openings in the stack occurs while all of the individual trench openings in the stack are completely filled with sacrificial material.

* * * * *